(12) United States Patent
Tian et al.

(10) Patent No.: US 8,173,450 B1
(45) Date of Patent: May 8, 2012

(54) METHOD OF DESIGNING AN ETCH STAGE MEASUREMENT SYSTEM

(75) Inventors: Xinkang Tian, San Jose, CA (US); Manuel Madriaga, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/027,227

(22) Filed: Feb. 14, 2011

(51) Int. Cl.
*H01L 21/00* (2006.01)
*H01L 21/66* (2006.01)
*H01L 21/302* (2006.01)
*G01R 31/26* (2006.01)

(52) U.S. Cl. .................... 438/14; 438/5; 438/9; 438/16; 438/17; 438/714; 257/E21.002; 257/E21.521; 257/E21.528; 257/E21.529

(58) Field of Classification Search ........... 257/E21.002, 257/E21.521, E21.528, E21.529
See application file for complete search history.

(56) References Cited

U.S. PATENT DOCUMENTS

| | | | |
|---|---|---|---|
| 5,288,367 A | 2/1994 | Angell | |
| 5,658,423 A | 8/1997 | Angell | |
| 5,862,060 A | 1/1999 | Murray | |
| 6,785,638 B2 | 8/2004 | Niu | |
| 6,943,900 B2 | 9/2005 | Niu | |
| 6,979,578 B2 | 12/2005 | Venugopal | |
| 7,216,045 B2 | 5/2007 | Doddi | |
| 7,286,247 B2 | 10/2007 | Archie | |
| 7,467,064 B2 | 12/2008 | Vuong | |
| 7,742,177 B2 | 6/2010 | Li | |
| 7,761,250 B2 | 7/2010 | Tian | |
| 7,831,528 B2 | 11/2010 | Doddi | |
| 2002/0182760 A1* | 12/2002 | Wack et al. ..................... 438/14 |
| 2006/0014409 A1 | 1/2006 | Grinbergen | |
| 2006/0112796 A1 | 6/2006 | Saito | |
| 2008/0074658 A1* | 3/2008 | Davis et al. ................ 356/237.5 |
| 2008/0204734 A1* | 8/2008 | Dixon et al. ............... 356/237.3 |

OTHER PUBLICATIONS

Bevington, et al., Data Reduction and Error Analysis for the Physical Sciences, Third Edition, pp. 117-177, McGraw Hill, New York, United States.

* cited by examiner

*Primary Examiner* — Mohsen Ahmadi
(74) *Attorney, Agent, or Firm* — Manuel Madriaga

(57) ABSTRACT

Provided is a method for designing an etch stage measurement system involving an etch process for one or more layers on a substrate using an etch process tool. The etch process tool uses two or more metrology devices, at least one etch process sensor device, and a metrology processor, the etch stage measurement system configured to meet two or more etch stage measurement objectives. A correlation algorithm using the etch stage measurements to the actual etch stage data is developed and used to extract etch measurement value. If the set two or more etch stage measurement objectives are not met, the optical metrology devices are modified, a different etch process sensor device is selected, the correlation algorithm is refined, and/or the measurement data is enhanced by adjusting for noise.

18 Claims, 13 Drawing Sheets

METHOD OF DESIGNING AN ETCH STAGE MEASUREMENT SYSTEM

BACKGROUND

1. Field

The present application generally relates to the design of an etch process control system to measure a structure formed on a workpiece, and, more particularly, to a method of monitoring an etch process to meet two or more etch stage measurement objectives.

2. Related Art

During semiconductor processing, an etch process, for example, a reactive ion etch (RIE) process, is employed for etching fine line patterns in a workpiece such as a silicon substrate or wafer. RIE involves positioning a wafer in a chamber that contains a plasma. The plasma contains gases that are dissociated in a radio frequency field so that reactive ions contained in the gases are accelerated toward the wafer surface. The reactive ions combine chemically with material on the wafer surface. During the etch process, one or more layers of material can be removed. Endpoint determination or detection is used in controlling etch processes.

As the one or more layers of material are etched, the volatile etch products are incorporated into the plasma. As the RIE process approaches the interface or end of the layer being etched, the amount of volatile etch product found in the plasma decreases. The amount of volatile etch product in the plasma can be tracked to determine the endpoint of the ME process. One of the species can be tracked such as one of the etchant gases used to etch a layer of material. As the layer is etched, the reactive species will be used up and relatively low concentrations of the reactive species will be found in the plasma. As more and more of the layer or layers are used up, the reactive species will be found in the plasma in increasingly higher concentrations. A time graph of the optical emissions from such a reactive species will show an increase in intensity as the layer is etched away. Tracking the intensity of a wavelength for a particular species using optical emission spectroscopy (OES) can also be used for endpoint determination or etch process control such as an RIE process.

Typically, OES has been used to track the amount of either volatile etch products or reactive species as a function of film thickness. These techniques examine emissions from either the volatile etch products or reactive species in the plasma. For example, during an RIE process, plasma discharge materials, such as etchant, neutral, and ions in the plasma, are continuously excited by collisions. An optical emission spectrometer diffracts emissions into its component wavelengths. A specific wavelength can be associated with a particular species, and this association can be used to detect an etch endpoint. However, such specific wavelength information is typically unavailable, and it is difficult to select an appropriate wavelength to use for accurate etch endpoint determination due to numerous possibilities for emissions. The optimal wavelength or wavelengths are not readily known due to number of variables in a typical etch process. For example, the OES spectrum for a typical RIE etch can be composed of hundreds of wavelengths in the visible and ultraviolet bands.

In addition, there is a trend towards using high-density plasma sources to replace RIE. Examples include use of a high-density, inductively-coupled plasma (ICP). Another example is in the use of electron cyclotron resonance (ECR), which differs from RIE in plasma formation. Generally, ECR operates at a lower pressure than a regular RIE system, and is, therefore, able to etch finer line trenches. Comparison studies of the emissions from high-density ICP, ECR and RIE plasmas show emphasis on different species and different wavelengths for similar input gas compositions. The data accumulated from RIE emissions may not be applicable to high-density ICP emissions and ECR emissions.

Prior art techniques for determining an endpoint in an etching process using OES spectra are described, for example, in U.S. Pat. No. 5,288,367, to Angell et al., entitled "END-POINT DETECTION", in U.S. Pat. No. 5,658,423, to Angell et al., entitled "MONITORING AND CONTROLLING PLASMA PROCESSES VIA OPTICAL EMISSION USING PRINCIPAL COMPONENT ANALYSIS". These prior art techniques typically entail selecting one wavelength to be used for signaling an etch endpoint, however. A prior art technique for performing process control by statistical analysis of the optical spectrum of a product produced in a chemical process is described, for example, in U.S. Pat. No. 5,862,060, to Murray, Jr., entitled "MAINTENANCE OF PROCESS CONTROL BY STATISTICAL ANALYSIS OF PRODUCT OPTICAL SPECTRUM" ('060). The '060 patent describes measuring the optical spectrum of each member of a calibration sample set of selected products, determining by Principal Component Analysis (PCA) or Partial Least Squares, (PLS).

Problems with aforementioned techniques for determining an endpoint in an etching process using PCA applied to OES spectra includes the uncertainty of the number of components to use in the PCA analysis. More principal components used, the better PCA approximates the system being analyzed, but more computer resources are needed. Moreover, determining the optimal number of PCA principal components is also time intensive and uses a lot of resources.

Furthermore, state-of-the art OES systems are capable of collecting a plurality of wavelengths of optical emission spectra emanating from the glow discharge of gases in a plasma etch chamber. These wavelengths can be associated with the specific chemical species generated from entering reactant gases, can result from gas phase reactions as well as reactions on the wafer and chamber surfaces. The wavelengths of the optical emission spectra can also shift as the surface composition of the wafer shifts from a steady-state etch to the complete removal of the etched material. Detection of this shift allows for etch endpoint determination, indicating the completion of the required etch and also can allow for termination of the etch process before over-etching occur. However, the number of OES frequencies or wavelengths available to determine an etch endpoint creates the problem of a complex and time consuming selection of the appropriate OES wavelengths.

Endpoint in an etching process can also be determined using a broadband light source process; endpoint detection are described, for example, in U.S. Pat. No. 6,979,578 to Venugopal, entitled "PROCESS ENDPOINT DETECTION METHOD USING BROADBAND REFLECTOMETRY", using multiple optical signals obtained from multiple measurement location are described in U.S. Patent Application No. 2006/0012796 to Saito et al., entitled "PLASMA TREATMENT APPARATUS AND LIGHT DETECTION METHOD OF A PLASMA TREATMENT", and using at least two optical components for endpoint detection for photomask etching in U.S. Patent Application No. 2006/0014409 to Grimbergen entitled "ENDPOINT DETECTION FOR PHOTOMASK ETCHING". As mentioned above, there is the problem of selecting the appropriate metrology tools that will work for a semiconductor application or range of applications using the aforementioned techniques. Furthermore, there is a need to optimize the selection of wavelength or wavelengths, specific optical metrology tools, and algorithms for extraction of etch stage measurement to meet measurement monitoring objectives. Moreover, in an integrated metrology fabrication cluster, there is a need to complete etch measurement monitoring in real-time and extraction of etch stage data to meet targeted time ranges. In other etching applications, there is also a need to ensure the repeatability and reproducibility of the extracted etch stage data from the etch stage measurements.

The present invention is directed to minimizing the effects of one or more of the problems discussed above. With increased requirement for throughput, decreasing size of the structures, and requirement for lower cost of ownership, there is greater need to optimize design of etch stage measurement systems to meet one or more etch stage measurement objectives.

SUMMARY

Provided is a method for designing an etch stage measurement system involving an etch process for one or more layers on a substrate using an etch process tool. The etch process tool uses two or more metrology devices, at least one etch process sensor device, and a metrology processor, the etch stage measurement system configured to meet two or more etch stage measurement objectives. A correlation algorithm using the etch stage measurements to the actual etch stage data is developed and used to extract etch measurement value. If the set two or more etch stage measurement objectives are not met, the optical metrology devices are modified, a different etch process sensor device is selected, the correlation algorithm is refined, and/or the measurement data is enhanced by adjusting for noise.

BRIEF DESCRIPTION OF DRAWINGS

FIG. 13A depicts a top-view of exemplary etch system with a viewport for optical emission spectroscopy whereas

DETAILED DESCRIPTION OF EXEMPLARY EMBODIMENT(S)

In order to facilitate the description of the present invention, a semiconductor wafer can be utilized to illustrate an application of the concept. The methods and processes equally apply to other workpieces that have repeating structures. The workpiece can be a wafer, a substrate, disk, or the like. Furthermore, in this application, the term structure when it is not qualified refers to a patterned structure.

Figure 1A:
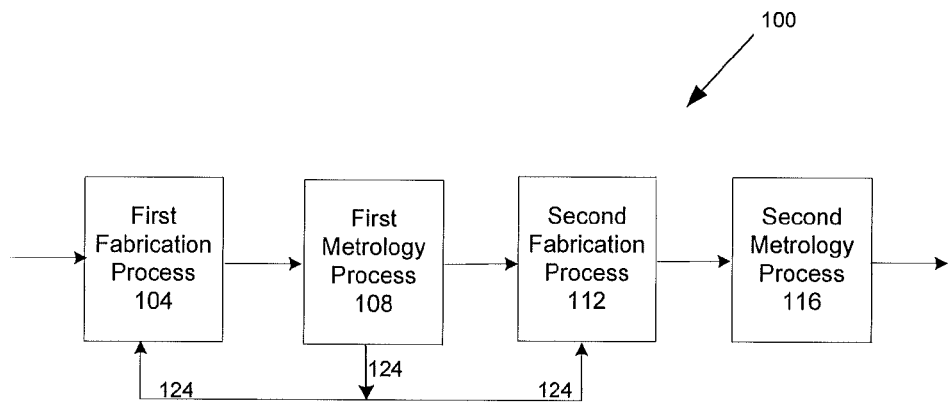
FIG. 1A is an architectural diagram illustrating prior art method of utilizing metrology data for controlling prior or later processes in the substrate fabrication flow.

FIG. 1A is an architectural diagram illustrating prior art method of utilizing metrology data for controlling prior or later processes in the workpiece fabrication flow. Prior art for fabrication stage measurement typically includes a fabrication system 100 performing a first fabrication process 104 on a workpiece (not shown). The workpiece can be a substrate, wafer, or magnetic memory and the like. After a set time period from the start of the first fabrication process 104 or at the end of the first fabrication process 104, the workpiece is measured using a first metrology process 108. Based on the recipe for the workpiece application, measurement data 124 from the first metrology process 108 are compared to expected results and are transmitted either to fabrication cluster controller (not shown) or to the first fabrication process 104 or to the second fabrication process 112. If the measurement data 124 from the first metrology process 108 are outside of the range of expected results, a signal can be sent to a second fabrication process 112 or to the first fabrication process 104. Similarly, after a set time period from the start of the second fabrication process 112 or at the end of the second fabrication process 112, the workpiece is measured using a second metrology process 116 and the fabrication and measurement is repeated as determined by the application recipe. The measurement data 124 transmitted to the first fabrication process 104 can be used to adjust a process parameter or tool setting in the first fabrication process 104. Similarly, the measurement data 124 transmitted to the second fabrication process 112 can be used to adjust a process parameter or tool setting in the second fabrication process 112.

Figure 1B:
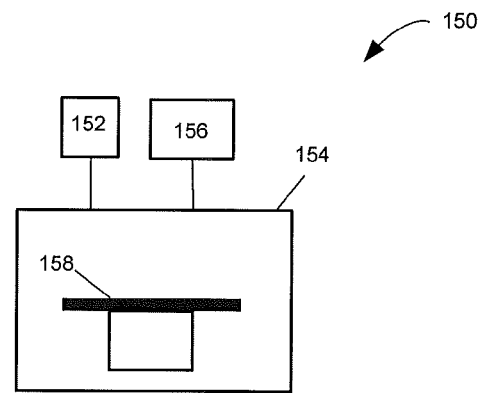
FIG. 1B is an architectural diagram of prior art etch measurement system for utilizing optical metrology data.

FIG. 1B is an architectural diagram of prior art etch measurement system for utilizing optical metrology data. For example, etch measurement system 150 comprises a processing chamber 154 and a wafer on a wafer holder. The processing chamber 154 can include a first optical metrology device 152 and a second optical metrology device 156 coupled to the processing chamber 154 to make measurements to determine etch endpoint.

As mentioned above, a drawback to the prior art techniques is that the accuracy and suitability of an optical etch measurement system includes the problem of selecting the appropriate metrology tools that will work for a semiconductor application or range of applications. In addition, the techniques require previous knowledge and historical data to select wavelength or wavelengths, specific optical metrology devices, and algorithms for extraction of etch stage measurement to meet measurement monitoring objectives. Furthermore, in an integrated metrology fabrication cluster, there is a need to complete etch measurement and extraction of etch stage data in real-time to meet targeted time ranges.

The present invention is directed to reducing the effects of several of the problems set forth above. With increased requirement for throughput, decreasing size of the structures, and requirement for lower cost of ownership, there is greater need to optimize design of etch stage measurement systems to meet two or more etch stage measurement objectives.

Etch stage measurement objectives can include accuracy, confidence interval, measurement and extraction time (MAET), repeatability, precision, reproducibility, total measurement uncertainty (TMU), total cost of ownership, and the like. Accuracy is the degree of agreement between a measured or calculated value of the etch stage compared to the actual value of the etch stage or a reference value established using scanning electron microscope (SEM), atomic force microscope (AFM), or the like. Confidence interval is the probability that the etch stage measurement will fall between an upper and lower limit. For example, an etch stage measurement of 50% complete can have a confidence interval of for example, etch stage mean+/−5%. Speed of measurement and extraction completion can be measured in milliseconds or less. Repeatability or test-retest reliability is the variation in measurements taken by a single person or instrument on the etch structure and under the same conditions and maybe expressed as a repeatability coefficient, the value below which the absolute difference between two or more repeated test results can be expected to be with a probability of, for example, 95 percent. Reproducibility is the ability of the etch stage measurement system to obtain the same results using other metrology systems, usually expressed as a standard deviation. TMU is calculated based on a linear regression analysis and removing a reference measuring system uncertainty ($U_{RMS}$) from a net residual error. For a detailed description of calculating TMU for metrology instruments, refer to U.S. Pat. No. 7,286,247 entitled "ASSESSMENT AND OPTIMIZATION FOR METROLOGY INSTRUMENT INCLUDING UNCERTAINTY OF TOTAL MEASUREMENT UNCERTAINTY", issued Oct. 23, 2007 and is included herein in its entirety by reference. Total cost of ownership includes cost of acquisition and operating costs, sometimes referred to as internal rate of return or economic value added. Two or more of the above etch stage measurement objectives can be used to optimize the design of the etch measurement system.

Figure 2:
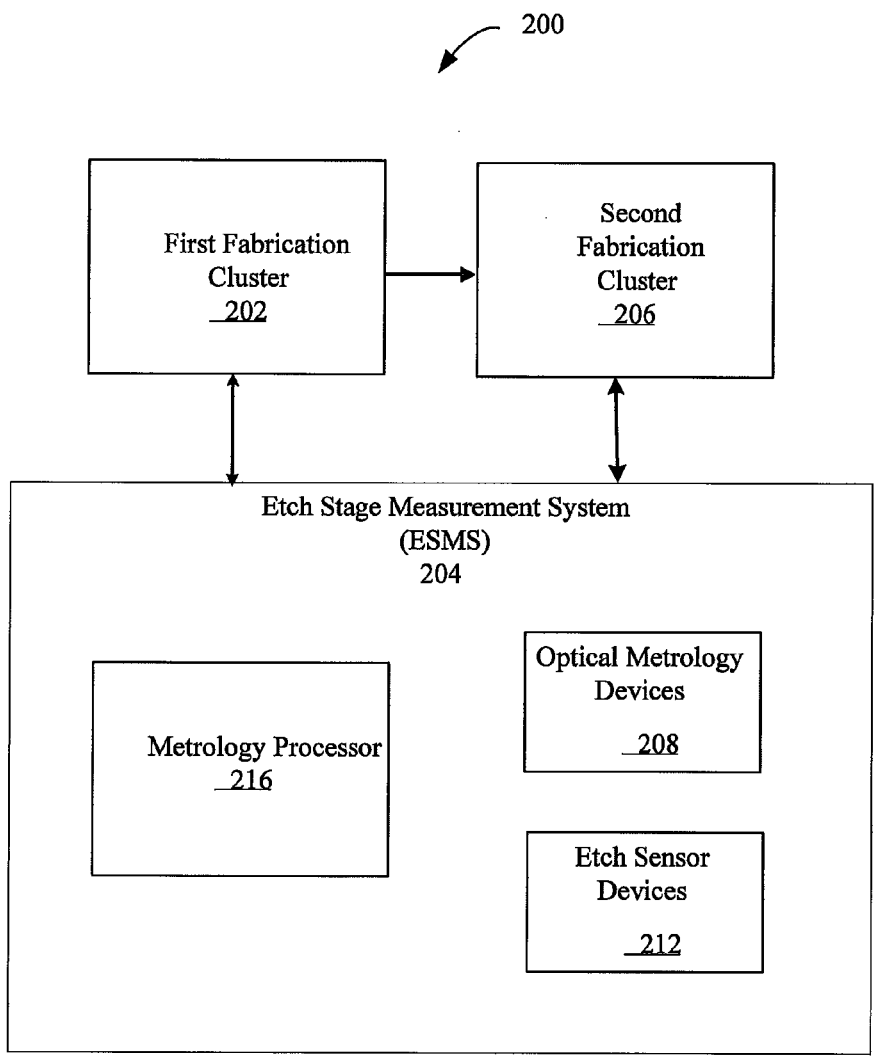
FIG. 2 depicts an exemplary architectural diagram illustrating a real-time process control systems using an etch stage measurement system to adjust at least one process parameter or tool setting in the same or another fabrication cluster.

FIG. 2 depicts an exemplary architectural diagram illustrating a real-time etch process control system 200 configured to perform real-time process control using an etch stage measurement system (ESMS) 204 to adjust at least one process parameter or tool setting in the first fabrication cluster 202 or the second fabrication cluster 206 using an extracted stage measurement value. The etch process control system 200 is configured to measure the etch stage of an etch process being done in the first fabrication cluster 202 where the first fabrication cluster 202 is coupled to ESMS 204. The ESMS 204 comprises a metrology processor 216, optical metrology devices 208 and etch sensor devices 212. The optical metrology devices 208 can be an optical emission spectroscopy device and/or one or more spectroscopic reflectometers, ellipsometers, and/or interferometers. In one embodiment, metrology processor 216 can be a stand alone processor. In another embodiment, metrology processor 216 can be locally located relative to the first fabrication cluster 202, or it can be remotely located relative to the first fabrication cluster 202 via an internet or intranet. Thus, metrology processor 216 can exchange data with the first fabrication cluster 202 using at least one of a direct connection, an intranet, or the internet. Metrology processor 216 can be coupled to an intranet at a customer site (i.e., a device maker, etc.), or coupled to an intranet at a vendor site (i.e., an equipment manufacturer). Furthermore, another computer (i.e., controller, server, etc.) can access metrology processor 216 to exchange data via at least one of a direct connection, an intranet, or the internet.

The etch sensor devices 212 can be a device that measures an etch process parameter that correlates to etch stage, etch rate, etch selectivity, and/or etch uniformity across the substrate. For example, the etch sensor devices 212 can include a device that measures a process parameter such as power, voltage, phase, current applied to the processing chamber, pressure, etchant gas flow, gas ratio of gases used, radio frequency delivered, temperature, and the like. The etch sensor devices 212 can be one or more different type of devices capable of measuring one or more of the aforementioned process parameters. The metrology processor 216 in ESMS 204 can be a processor locally coupled to the first fabrication cluster 202 and to the second fabrication cluster 206. Alternatively, the metrology processor 216 can be linked to first fabrication cluster 202 and to the second fabrication cluster 206 remotely via an intranet, dedicated network of various processors, or connected via the Internet. The metrology processor 216 can include input devices, displays, storage, controllers, and instruction codes or software code to facilitate the conversion, enhancement, and transformation of measurements from the optical metrology device and/or etch sensor device into an etch stage value or etch completion percent in real-time. More details of the steps used ESMS 204 will be discussed in the balance of the specification below.

Still referring to FIG. 2, the first fabrication cluster 202 includes an etch process tool (not shown) coupled to the ESMS 204 and to the second fabrication cluster 206. In one embodiment, the second fabrication cluster 206 can include a cleaning process tool, a deposition process tool, a photolithography tool, or another etch tool disposed after the first fabrication cluster 202 in the manufacturing flow. In another embodiment, the second fabrication cluster 206 can include a cleaning process tool, a deposition process tool, a photolithography tool, or another etch process tool and can be disposed before the first fabrication cluster 202 in the manufacturing flow.

Figure 3:
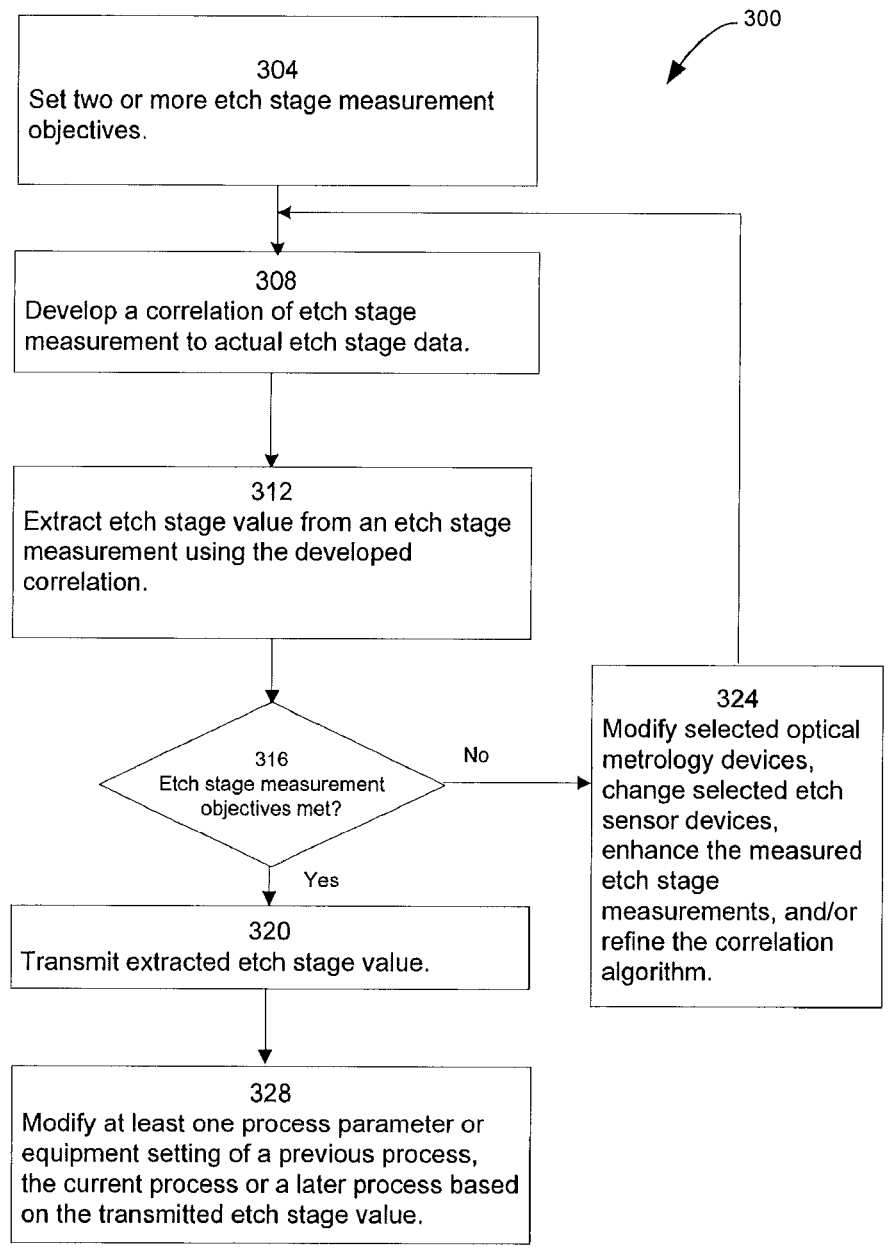
FIG. 3 depicts an exemplary flowchart of a process using an etch stage measurement system to monitor etch stage processing configured to meet two or more etch stage measurement objectives.

FIG. 3 depicts an exemplary flowchart 300 of a substrate process using an etch stage measurement system (ESMS) to monitor etch processing configured to meet two or more etch stage measurement objectives. In step 304, two or more etch stage measurement objectives are set. As mentioned above, the two or more etch stage measurement objectives can include accuracy, confidence interval, measurement and extraction time (MAET), repeatability, reproducibility, total measurement uncertainty (TMU), and/or total cost of ownership. In one embodiment, the two or more etch stage measurement objectives include accuracy and measurement and extraction time. In another embodiment, accuracy can be set at 0.95 or better and measurement and extraction time set at 6.0 milliseconds or less. The MAET can be a range of times that meet the requirements of the semiconductor application recipe and substrate throughput. In another embodiment, the two or more etch stage measurement objectives include accuracy, measurement and extraction time, and TMU of 5% or less. In yet another embodiment, the two or more etch stage measurement objectives include accuracy, measurement and extraction time, and repeatability expressed as a repeatability coefficient where two or more repeated test results are the same with a probability of 95% or better.

In step 308, a correlation of etch stage measurement to actual etch stage data is developed. Actual etch stage data can be a reference value of the completion of the etching process, for example, an etch stage data can be 90% when a target layer or layers to be etched is 90% complete. Alternatively, actual etch stage data can be expressed as actual height of the layer or layers etched, for example, 50 nanometers of a silicon nitride layer. Actual etch stage data can be obtained using reference measurement systems such as those using SEM, AFM, or optical digital profilometry, such AcuShape™ owned by Tokyo Electron Limited and KLA-Tencor Corporation. As mentioned above, the etch stage data can be expressed as percentage completion of an etch process of one or more layers in a substrate. In one embodiment, the correlation of etch stage measurement to actual etch stage data can be in the form of a linear equation. In another embodiment, the correlation can be stated more generally, for example, as a second-order polynomial that can be fitted to any number of etch stage measurements measured using different optical metrology devices and sensor measurements measured using different etch sensor devices.

Although a linear relationship of the variables is used in the examples above, it should be recognized that non-linear functional relationships between the variables can be used, such as arbitrary functions, composite functions, and the like. Least squares fit solutions to a polynomial can include the determinant, matrix, independent parameter solutions, and the like. Least squares fit to an arbitrary function can include nonlinear fitting methods, searching parameter space methods, grid search methods, gradient search methods, expansion methods, the Marquardt method, and the like. For a more detailed discussion of these techniques, see Bevington, et al., "Data Reduction and Error Analysis for the Physical Sciences," Third Edition, pages 116-177, which is incorporated herein by reference.

Still referring to FIG. 3, step 308, in an embodiment, the developed correlation can be a data store such as a database or library that comprises an etch stage measurement and corresponding actual etch stage data. For example, the database or library can include optical metrology measurements such as beam intensity as a function or wavelength and corresponding actual etch stage data. In another embodiment, the developed correlation can be a machine learning system trained to use input optical metrology measurements to determine an output etch stage data.

In step 312, etch stage value is extracted using the etch stage measurements and the developed correlation. In an embodiment, the etch stage measurements can be two or more optical metrology measurements. In another embodiment, etch stage measurements can be two or more optical metrology measurements and at least one etch sensor measurement. In still another embodiment, the etch stage measurements can be a plurality of optical metrology measurements and a plurality of etch sensor measurements. In step 316, the determined etch stage value is used to calculate if the etch stage measurement objectives are met. In an embodiment, assume that the etch stage measurement objectives include etch stage accuracy at 0.95 or better and measurement and extraction time at 2.0 milliseconds or less. The calculated etch stage accuracy using the etch stage value is compared to 0.95 and the total of actual elapsed time of the measurements and extraction time are compared to 2 milliseconds. In another embodiment, etch stage measurement objectives can include a confidence interval, for example, etch stage mean+/−5% in addition to etch stage accuracy at 0.95 or better and measurement and extraction time of 2.0 milliseconds or less.

If the etch stage measurement objectives are not met, in step 324, the metrology devices are modified, the etch stage measurements are enhanced, and/or the correlation algorithm is refined. Modification of the optical metrology devices can be done by adjusting optical components or changing some of the optical components in the optical metrology devices. For more detailed description of altering the design of optical metrology devices, refer to U.S. Pat. No. 7,761,250 entitled "AN OPTICAL METROLOGY SYSTEM OPTIMIZED WITH DESIGN GOALS", issued on Jul. 10, 2010, included herein in its entirety by reference. In another embodiment, the selected metrology sensor device can be changed, for example, selecting a pressure sensor instead of a temperature sensor. The etch stage measurement can be enhanced by adjusting for noise in the signal. Systematic noise can be adjusted through calibration of the optical metrology devices with substrate samples for the range of applications that will be measured. For detailed description of optical metrology signal noise reduction, refer to U.S. Pat. No. 7,742,177 "NOISE-REDUCTION METROLOGY MODELS", issued on Jun. 22, 2010 included herein in its entirety by reference. Refining the correlation algorithm can include changing the technique from using a linear correlation to a non-linear correlation, i.e., non-linear functional relationships between the variables can be used. As mentioned above, non-linear functional relationships include arbitrary functions, composite functions, and the like. Least squares fit solutions to a polynomial can include the determinant, matrix, independent parameter solutions, and the like. Least squares fit to an arbitrary function can include nonlinear fitting methods, searching parameter space methods, grid search methods, gradient search methods, expansion methods, the Marquardt method, and the like.

Still referring to FIG. 3, in step 320, the extracted etch stage value is transmitted. In one embodiment, the etch stage value is transmitted to a metrology processor, (FIG. 2, 216) that can be coupled to a first fabrication cluster 202 or to a second fabrication cluster 206. In step 328, in FIG. 3, the transmitted etch stage value is used to modify at least one etch process control parameter or equipment setting of the first fabrication cluster 202 or the second fabrication cluster 206.

Figure 4:
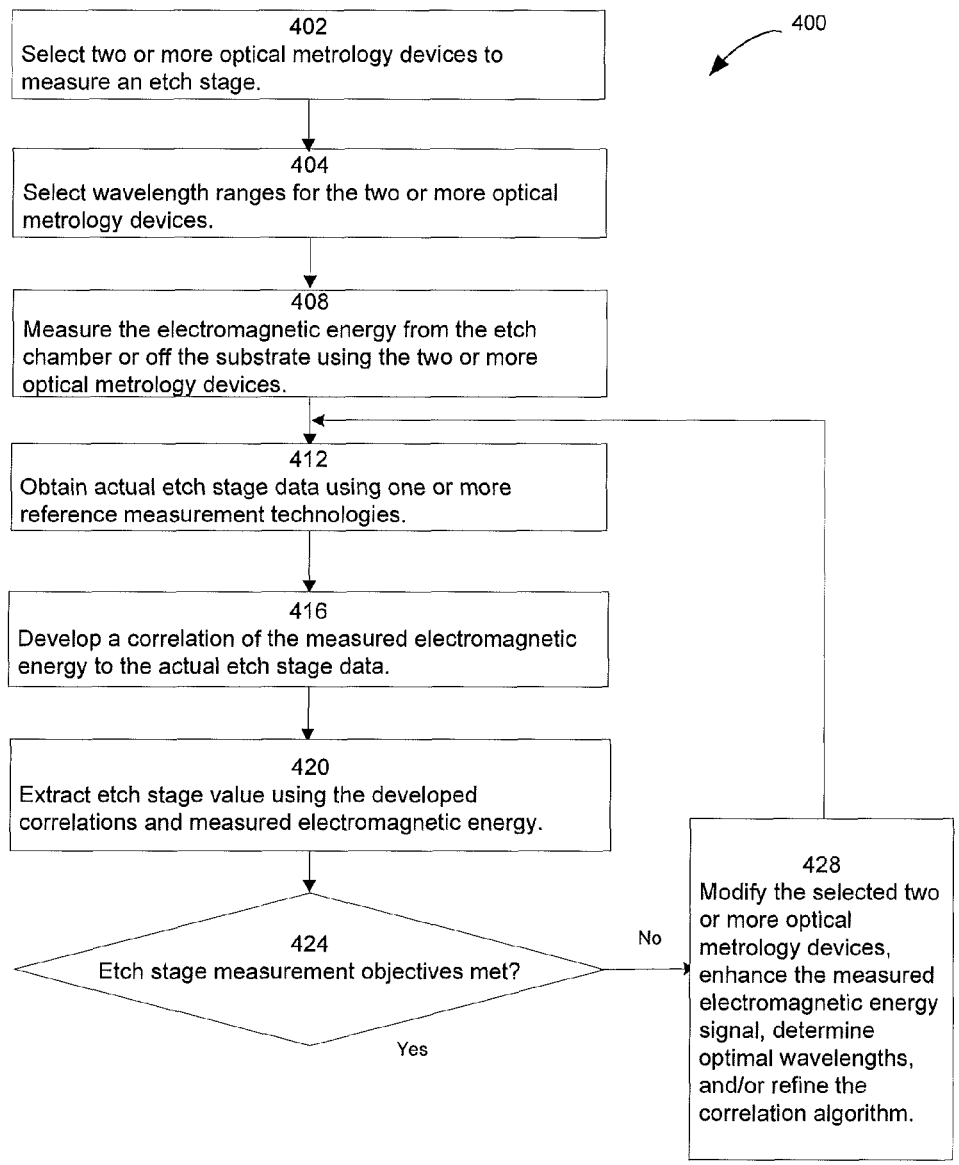
FIG. 4 depicts an exemplary flowchart for monitoring an etch process using two or more optical metrology devices configured to meet two or more etch stage measurement objectives.
Figure 5:
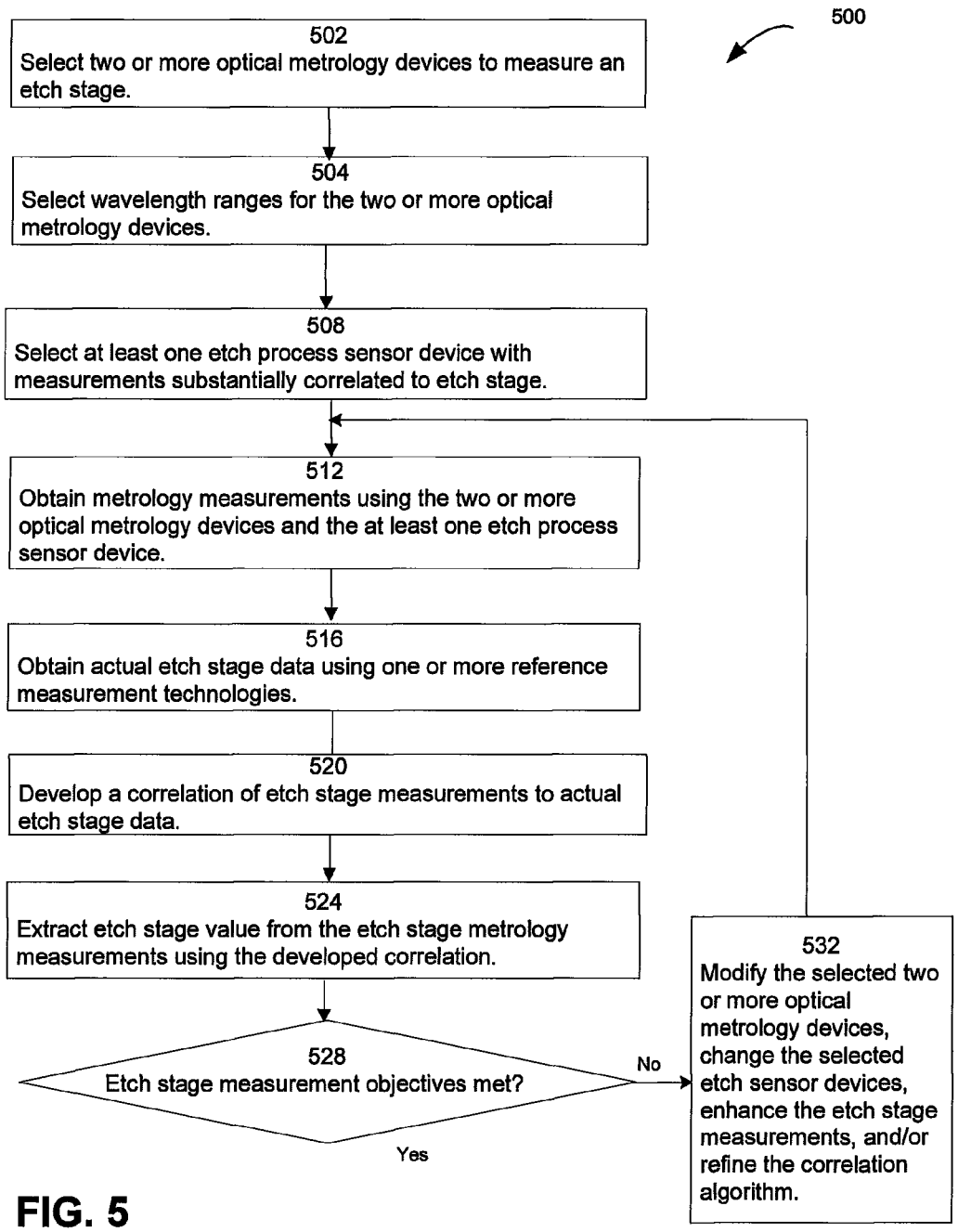
FIG. 5 depicts an exemplary flowchart for monitoring an etch process using two or more optical metrology devices and at least one etch sensor device configured to meet etch stage measurement objectives.
Figure 6:
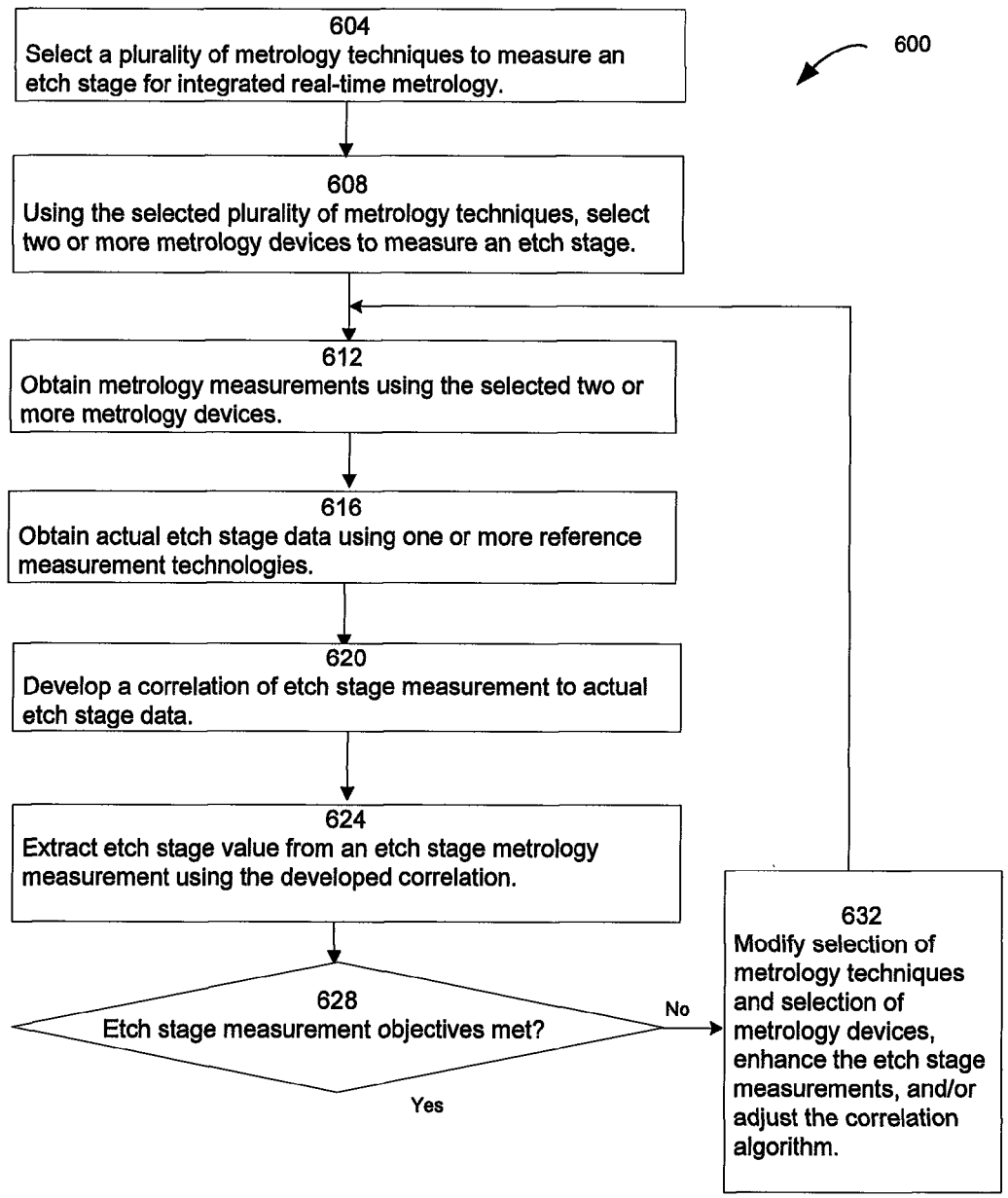
FIG. 6 depicts an exemplary flowchart for monitoring an etch process using a plurality of optical metrology devices and etch sensor devices configured to meet etch stage measurement objectives.

FIGS. 4, 5, and 6 depict exemplary flowcharts for developing a correlation of etch stage measurement to actual etch stage data using different combinations of etch stage measurement devices. FIG. 4 depicts a flowchart utilizing two or more optical metrology devices whereas FIG. 5 depicts a flowchart utilizing two or more optical metrology devices and at least one etch sensor device. FIG. 6 depicts a flowchart utilizing a plurality of metrology techniques where two or more optical metrology devices and two or more etch sensor devices can be utilized.

FIG. 4 depicts an exemplary flowchart 400 for developing a correlation of etch stage measurement to actual etch stage data using two or more optical metrology devices configured to meet etch stage measurement objectives. In step 402, two or more optical metrology devices are selected to measure an etch stage. Depending on the recipe, the etch stage can be partial or complete etching of one or more layers of the substrate. The selected two or more optical metrology devices can be a combination of an optical emission spectroscopy device, an interferometer, reflectometer, an ellipsometer or any combination of the aforementioned. In step 404, a wavelength or a range of wavelengths can be selected for the two or more optical metrology devices. In one embodiment, the wavelength range can be 120-190 nm. In another embodiment, the wavelength range can be 170-190 nm. In still another embodiment, the wavelength range can be 120-1000 nm. The selection of wavelength ranges is based on the substrate application, previous historical experience with a similar application, the vendor of the optical metrology devices, and the set two or more etch stage measurement objectives.

In step 408, electromagnetic energy from the etch chamber or diffracted off the workpiece are measured using the selected two or more optical metrology devices. In step 412, actual etch stage data corresponding the measured electromagnetic energy are obtained using one or more reference measurement technologies. Reference measurement technologies such as those using SEM, AFM, or optical digital profilometry, such AcuShape™ owned by Tokyo Electron Limited and KLA-Tencor Corporation. As mentioned above, actual etch stage data can be a reference value of the completion of the etching process, for example, an etch stage data can be 90% when a target layer or layers to be etched is 90% complete. Alternatively, actual etch stage data can be expressed as actual height of the layer or layers etched, for example, 50 nanometers of a silicon nitride layer.

In step 416, the measured electromagnetic energy data is correlated to the actual etch stage data. In one embodiment, the correlation of etch stage measurement to actual etch stage data can be in the form of a linear equation. Alternatively, the correlation can be expressed as a linear relationship of the variables or a non-linear functional relationship between the variables such as arbitrary functions, composite functions, and the like. Least squares fit solutions to a polynomial can include the determinant, matrix, independent parameter solutions, and the like. Least squares fit to an arbitrary function can include nonlinear fitting methods, searching parameter space methods, grid search methods, gradient search methods, expansion methods, the Marquardt method, and the like. As mentioned above, for a more detailed discussion of these techniques, see Bevington, et al., "Data Reduction and Error Analysis for the Physical Sciences," Third Edition, pages 116-177, which is incorporated herein by reference.

Still referring to step 416, in an embodiment, the developed correlation can be a data store such as a database or library that comprises an etch stage measurement and corresponding etch stage data. For example, the database or library can include optical metrology measurements such as beam intensity as a function or wavelength and corresponding etch completion data. In another embodiment, the developed correlation can be a machine learning system trained to use input optical metrology measurements to determine an output etch completion data.

In step 420, etch stage value is extracted using the etch stage measurements and the developed correlation. In an embodiment, the etch stage measurements can be two or more optical metrology measurements. In step 424, the determined etch stage value is used to calculate if the etch stage measurement objectives set in FIG. 3, step 304, are met. In an embodiment, assume that the etch stage measurement objectives include accuracy at 0.95 or better and measurement and extraction time at 2.0 milliseconds or less. The calculated accuracy is compared to 0.95 and the actual elapsed time of the measurements plus extraction are compared to 2 milliseconds. In another embodiment, etch stage measurement objectives can include a confidence interval, for example, etch stage mean+/−5% in addition to etch stage accuracy at 0.95 or better and measurement and extraction time of 2.0 milliseconds or less.

If the etch stage measurement objectives are not met, in step 428, the two or more metrology devices are modified, the etch stage measurements are enhanced, optimal wavelengths used in metrology illumination beams are determined, and/or the correlation algorithm is refined. Modification of the metrology devices can be done by adjusting optical components or changing some of the optical components in the optical metrology devices. In another embodiment, depending on the type of etch application, the etch chamber can be purged with nitrogen or a noble gas to intensify the diffraction signal. Alternatively, enhancement of the measured etch stage signal can be done by adjusting for noise in the signal. Systematic noise can be adjusted through calibration of the optical metrology devices with substrate samples for the range of applications that will be measured.

The optimal wavelengths are determined for an optical metrology device using a regression technique or similar technique. For detail description of optimizing the wavelength selection for optical metrology, refer to U.S. Pat. No. 7,216,045 entitled "SELECTION OF WAVELENGTHS FOR INTEGRATED CIRCUIT OPTICAL METROLOGY", issued on May 8, 2007, included herein in its entirety by reference. Refining the correlation algorithm can include changing the technique from using a linear correlation to a non-linear correlation, i.e., non-linear functional relationships between the variables can be used. As mentioned above, non-linear functional relationships include arbitrary functions, composite functions, and the like. Least squares fit solutions to a polynomial can include the determinant, matrix, independent parameter solutions, and the like. Least squares fit to an arbitrary function can include nonlinear fitting methods, searching parameter space methods, grid search methods, gradient search methods, expansion methods, the Marquardt method, and the like. After step 428, process steps 412 through 432 are iterated until the etch stage measurement objectives are met.

FIG. 5 depicts an exemplary flowchart 500 for developing a correlation of etch stage measurement to actual etch stage data using two or more optical metrology devices and at least one etch sensor device configured to meet etch stage measurement objectives. In step 502, two or more optical metrology devices are selected to measure an etch stage. Depending on the recipe, the etch stage can be partial or complete etching of one or more layers of the workpiece. The selected two or more optical metrology devices can be a combination of an optical emission spectroscopy device, an interferometer, reflectometer, ellipsometer, or any combination of the aforementioned. In step 504, a wavelength or a range of wavelengths can be selected for the two or more optical metrology devices. In one embodiment, the wavelength range can be 120-190 nm. In another embodiment, the wavelength range can be 170-190 nm. In still another embodiment, the wavelength range can be 120-1000 nm. The selection of wavelength ranges is based on the substrate application, previous historical experience with a similar application, the vendor of the optical metrology devices, and the set two or more etch stage measurement objectives.

In step 508, at least one process sensor device with measurements substantially correlated to etch stage is selected. In one embodiment, the etch process sensor device that has the highest correlation to etch stage is selected. Selection of at least one process sensor device can be done using multivariate analysis, using sets of process data, metrology data (diffraction signals) and process performance data that can assist in identifying these inter-relationships. For example, the multivariate analysis can include a linear analysis, or a nonlinear analysis. Additionally, for example, the multivariate analysis can include Principal Components Analysis (PCA), Independent Component Analysis, Cross Correlation Analysis, Linear Approximation Analysis, and the like. For detail description of use of multivariate analysis in identifying principal variables, refer to U.S. Pat. No. 7,467,064 entitled "TRANSFORMING METROLOGY DATA FROM A SEMICONDUCTOR TREATMENT SYSTEM USING MULTIVARIATE ANALYSIS", issued on Dec. 16, 2008, included herein in its entirety by reference. In step 512, electromagnetic energy from the etch chamber or diffracted off the workpiece are measured using the selected two or more optical metrology devices and measurement from at least one etch process sensor device are obtained.

In step 516, actual etch stage data corresponding the measured electromagnetic energy and etch sensor measurements are obtained using one or more reference measurement technologies. Reference measurement technologies such as those using SEM, AFM, or optical digital profilometry, such AcuShape™ owned by Tokyo Electron Limited and KLA-Tencor Corporation. As mentioned above, actual etch stage data can be a reference value of the completion of the etching process, for example, an etch stage data can be 90% when a target layer or layers to be etched is 90% complete. Alternatively, actual etch stage data can be expressed as actual height of the layer or layers etched, for example, 50 nanometers of a silicon nitride layer.

In step 520, the measured electromagnetic energy data and etch sensor measurements are correlated to the actual etch stage data. In one embodiment, the correlation of etch stage measurement to actual etch stage data can be in the form of a linear equation. Alternatively, the correlation can be expressed as a linear relationship of the variables or a non-linear functional relationship between the variables such as arbitrary functions, composite functions, and the like. Least squares fit solutions to a polynomial can include the determinant, matrix, independent parameter solutions, and the like. Least squares fit to an arbitrary function can include nonlinear fitting methods, searching parameter space methods, grid search methods, gradient search methods, expansion methods, the Marquardt method, and the like. As mentioned above, for a more detailed discussion of these techniques, see Bevington, et al., "Data Reduction and Error Analysis for the Physical Sciences," Third Edition, pages 116-177, which is incorporated herein by reference.

Still referring to step 520, in an embodiment, the developed correlation can be a data store such as a database or library that comprises as etch stage measurement and corresponding etch stage data. For example, the database or library can include optical metrology measurements such as beam intensity as a function of wavelength, etch sensor measurements, and corresponding etch stage data. In another embodiment, the developed correlation can be a machine learning system trained to use input optical metrology measurements and/or and etch sensor measurements to determine output etch stage data.

In step 524, etch stage value is extracted using the etch stage measurements and the developed correlation. In an embodiment, etch stage measurements can be two or more optical metrology measurements and at least one etch sensor measurement. In another embodiment, the etch stage measurements can be a plurality of optical metrology measurements and a plurality of etch sensor measurements. In step 528, the determined etch stage value is used to calculate if the etch stage measurement objectives set in FIG. 3, step 304 are met. In an embodiment, assume that the etch stage measurement objectives include accuracy at 0.95 or better and measurement and extraction time at 2.0 milliseconds or less. The calculated etch stage accuracy is compared to 0.95 and the actual elapsed time of the measurements plus extraction are compared to 2 milliseconds. In another embodiment, etch stage measurement objectives can include a confidence interval, for example, mean+/−5% in addition to etch stage accuracy at 0.95 or better and measurement and extraction time at 2.0 milliseconds or less. In another embodiment, the etch stage measurement objectives include etch stage accuracy at 0.95 or better and measurement and extraction time at 6.0 milliseconds or less, and/or repeatability of 98%.

If the etch stage measurement objectives are not met, in step 532, the two or more optical metrology devices can be modified, the etch stage measurements enhanced, optimal wavelengths used by the optical metrology devices can be determined, and/or the correlation algorithm can be refined. Modification of the optical metrology devices can be done by adjusting optical components or changing some of the optical components in the optical metrology devices. In another embodiment, the selected etch sensor can be changed, for example, selecting a pressure sensor instead of a temperature sensor. In another embodiment, depending on the type of etch application, the etch chamber can be purged with nitrogen or a noble gas to intensify the diffraction signal. Alternatively, enhancement of the measured etch stage measurements can be done by adjusting for noise in the measurement. Systematic noise can be adjusted through calibration of the optical metrology devices and the at least one etch sensor device with substrate samples for the range of applications that will be measured.

The optimal wavelengths can be determined for an optical metrology device using a regression technique or similar technique. Refining the correlation algorithm can involved changing the technique from using a linear correlation to a non-linear correlation such as non-linear functional relationships between the variables can be used. As mentioned above, non-linear functional relationships include arbitrary functions, composite functions, and the like. Least squares fit solutions to a polynomial can include the determinant, matrix, independent parameter solutions, and the like. Least squares fit to an arbitrary function can include nonlinear fitting methods, searching parameter space methods, grid search methods, gradient search methods, expansion methods, the Marquardt method, and the like. After step 532, process steps 512 through 532 are iterated until the etch stage measurement objectives are met.

FIG. 6 depicts an exemplary flowchart 600 for developing a correlation of etch stage measurement to actual etch stage data using a plurality of metrology devices configured to meet etch stage measurement objectives. In step 604, a plurality of metrology techniques are selected to measure an etch stage for integrated real-time metrology. Metrology techniques include optical metrology, for example, optical emission spectroscopes, reflectometers, ellipsometers, and/or interferometers, and non-optical metrology, for example, process sensors with measurements substantially correlated to etch stage data such as completion of etch of one or more layers of the workpiece. In step 608, using the selected plurality of metrology techniques, two or more metrology devices are selected to measure an etch stage.

Selection of one or more process sensor devices can be done using multivariate analysis, using sets of process data, metrology data (diffraction signals) and process performance data to identify these inter-relationships. For example, the multivariate analysis can include a linear analysis, or a nonlinear analysis. Additionally, for example, the multivariate analysis can include Principal Components Analysis (PCA), Independent Component Analysis, Cross Correlation Analysis, Linear Approximation Analysis, and the like. In step 612, metrology measurements using the selected two or more metrology devices are obtained. Electromagnetic energy from the etch chamber or diffracted off the workpiece are measured using the selected one or more optical metrology devices or measurements from the one or more etch process sensor devices are obtained.

In step 616, actual etch stage data corresponding the measured electromagnetic energy or sensor measurements are obtained using one or more reference measurement technologies. Reference measurement technologies such as those using SEM, AFM, or optical digital profilometry, such AcuShape™ owned by Tokyo Electron Limited and KLA-Tencor Corporation. For example, the etch stage data can be expressed as percentage completion of an etch process of one or more layers in a substrate as a function of etch time.

In step 620, the measured electromagnetic energy and/or sensor data are correlated to the actual etch stage data. In one embodiment, the correlation of etch stage measurement to actual etch stage data can be in the form of a linear equation. Alternatively, the correlation can be expressed as a linear relationship of the variables or a non-linear functional relationship between the variables such as arbitrary functions, composite functions, and the like. Least squares fit solutions to a polynomial can include the determinant, matrix, independent parameter solutions, and the like. Least squares fit to an arbitrary function can include nonlinear fitting methods, searching parameter space methods, grid search methods, gradient search methods, expansion methods, the Marquardt method, and the like. Still referring to step 620, in an embodiment, the developed correlation can be a data store such as a database or library that comprises as etch stage measurement and corresponding etch stage data. For example, the database or library can include optical metrology measurements such as beam intensity's a function or wavelength and corresponding etch completion data. In another embodiment, the developed correlation can be a machine learning system trained to use input optical metrology measurements to determine an output etch completion data.

In step 624, etch stage value is extracted using the etch stage measurements and the developed correlation. In an embodiment, the etch stage measurements can be two or more optical metrology measurements. In another embodiment, the etch stage measurements can be a plurality of optical metrology measurements and etch sensor measurements. In step 628, the determined etch stage value is used to calculate if the etch stage measurement objectives set in FIG. 3, step 304, are met. In an embodiment, assume that the etch stage measurement objectives include etch stage accuracy at 0.95 or better and measurement and extraction time at 2.0 milliseconds or less. The calculated etch stage accuracy is compared to 0.95 and the actual elapsed time of the measurements plus extraction are compared to 2 milliseconds. In another embodiment, etch stage measurement objectives can include a confidence interval, for example, etch stage mean+/−6% in addition to etch stage accuracy at 0.95 or better and measurement and extraction time at 2.0 milliseconds or less. In yet another embodiment, the two or more etch stage measurement objectives include accuracy, measurement-and-extraction time, and repeatability expressed as a repeatability coefficient where two or more repeated test results being the same are within a probability of 95% or better.

If the stage measurement objectives are not met, in step 632, the selection of metrology techniques and metrology devices can be modified, the etch stage measurements can be enhanced, optimal wavelengths can be determined, and/or the correlation algorithm can be refined. As above, modification of the metrology devices can be done by adjusting optical components, for example, changing the angle of incidence of the illumination beam, changing the light source or changing some of the optical components in the optical metrology devices. In, another embodiment, a selected metrology sensor can be changed, for example, selecting an etchant pressure sensor instead of a temperature sensor. In another embodiment, depending on the type of etch application, the etch chamber can be purged with nitrogen or a noble gas to increase the beam intensity of the diffraction signal. Alternatively, enhancement of the measured metrology signal can be done by adjusting for noise in the signal. As mentioned above, systematic noise can be adjusted through calibration of the optical metrology devices with substrate samples for the range of applications that will be measured. The optimal wavelengths can be determined for an optical metrology device using a regression technique or similar technique. Refining the correlation algorithm can involve changing the technique from using a linear correlation to a non-linear correlation such as non-linear functional relationships between the variables can be used. As mentioned above, non-linear functional relationships can include arbitrary functions, composite functions, and the like. Least squares fit solutions to a polynomial can include the determinant, matrix, independent parameter solutions, and the like. Least squares fit to an arbitrary function can include nonlinear fitting methods, searching parameter space methods, grid search methods, gradient search methods, expansion methods, the Marquardt method, and the like. After step 632, process steps 612 through 632 are iterated until the etch stage measurement objectives are met.

Figure 7:
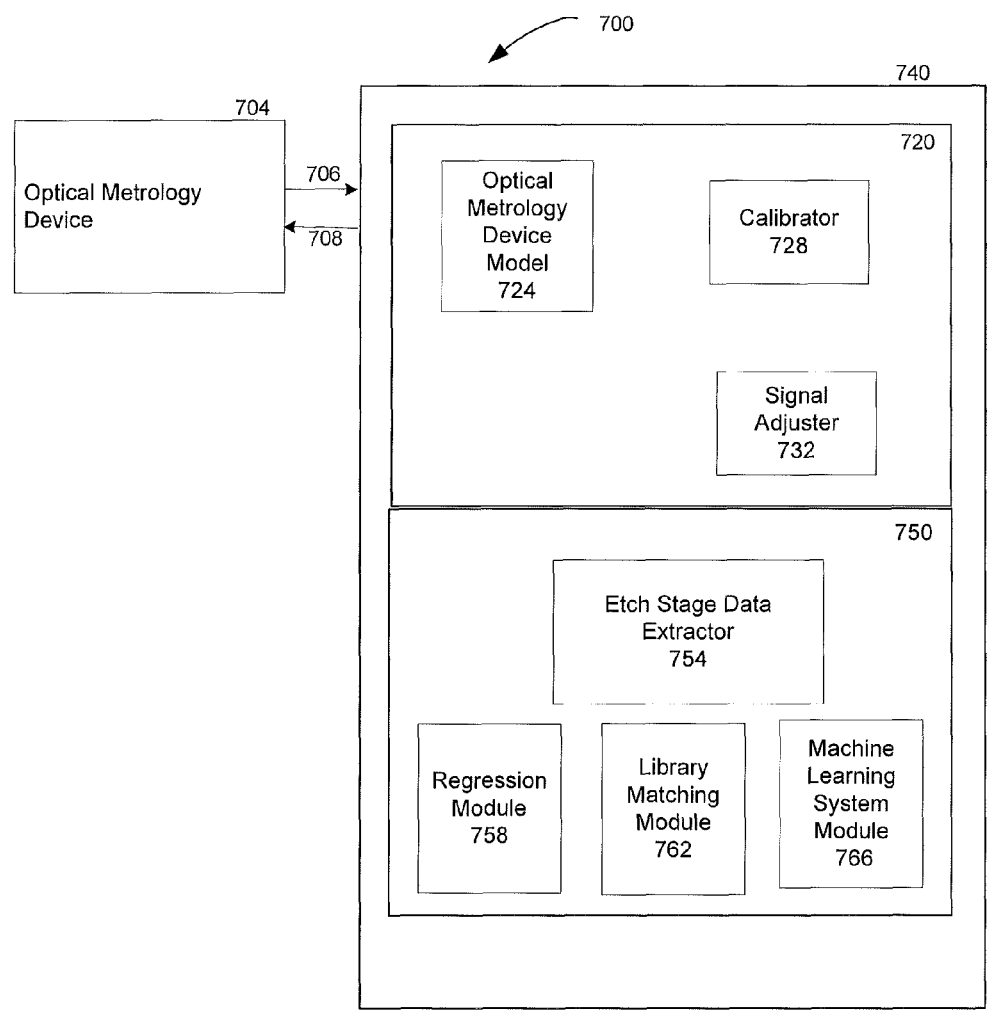
FIG. 7 is an exemplary architectural diagram illustrating an etch stage measurement system comprising an optical metrology device and a metrology processor.
Figure 8:
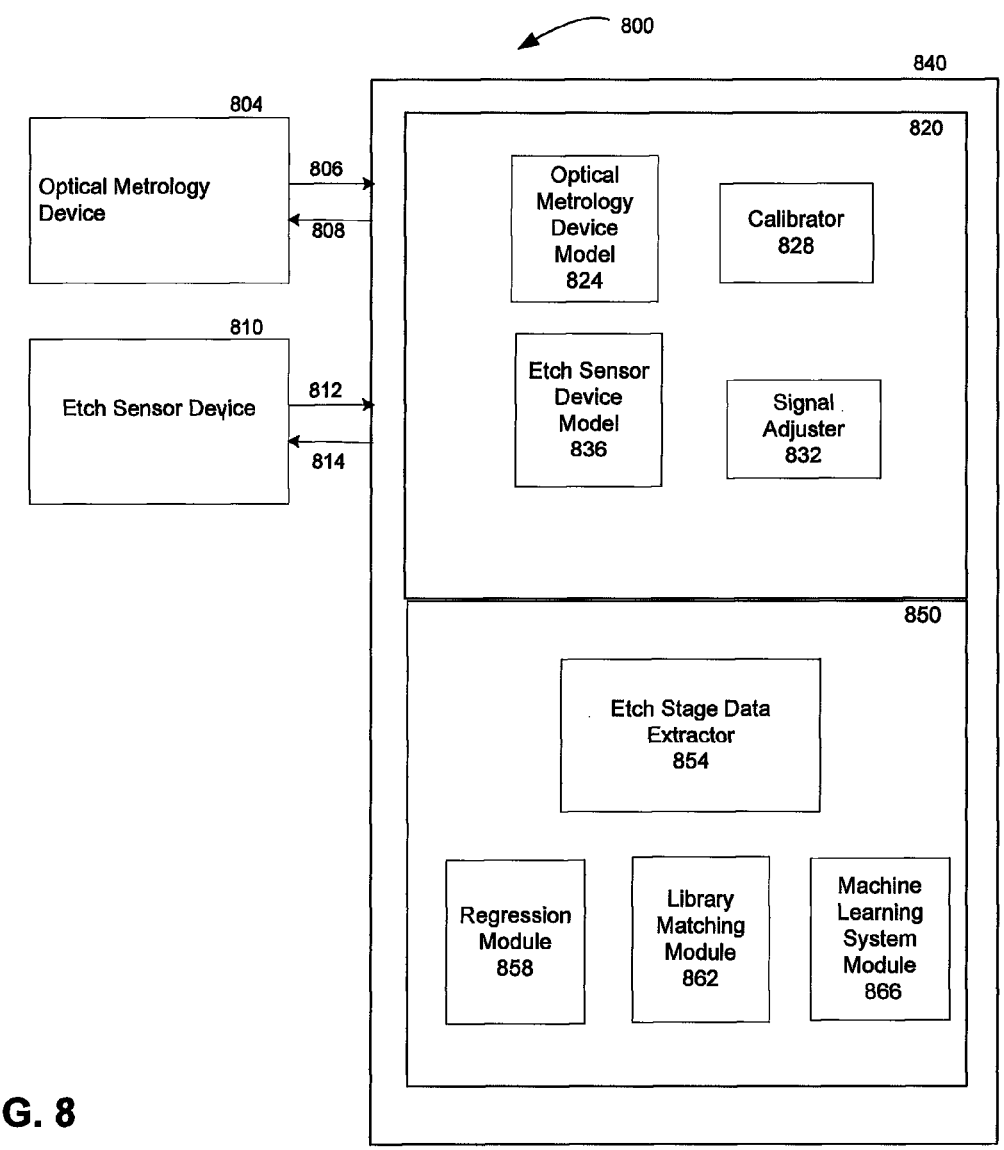
FIG. 8 is an exemplary architectural diagram illustrating an etch stage measurement system comprising an optical metrology device, an etch sensor device, a signal evaluator, and a etch stage extractor.

FIG. 7 and FIG. 8 are exemplary architectural diagrams illustrating etch stage measurement systems. Referring to FIG. 7, it is an exemplary architectural diagram illustrating an etch stage measurement system 700 comprising an optical metrology device 704 and a metrology processor 740. The metrology processor 740 can include a signal evaluator 720 and a metrology data estimator 750. The optical metrology device 704 can be two or more optical metrology devices such as a combination of one or more of an optical emission spectroscope, interferometer or reflectometer, measures a substrate (not shown) and transmits the etch stage measurement 706 to the metrology processor 740. After processing the measurements with the metrology processor 740, an adjustment signal 708 can be sent from the metrology processor 740, for example an angle of incidence adjustment or an azimuth angle adjustment, to the optical metrology device 704. The metrology processor 740 can be a local processor, a remote processor, or a processor accessible via a network such as the Internet. The signal evaluator 720 and the etch stage data extractor 754 can be in the form of executable instructions or computer code resident in the processor 740 or available for execution by the processor 740. The signal evaluator 720 comprises an optical metrology device model 724 which can model two or more optical metrology devices. Other components of the signal evaluator 720 include a calibrator 728 and a signal adjuster 732. The calibrator 728 is configured to determine adjustments to metrology measurements due to differences of components used in a metrology device compared to a standard device in the same category or technology. The signal adjuster 732 enhances the signal by adjusting for the noise in the measured electromagnetic signal for optical metrology device 704.

Still referring to FIG. 7, the metrology data estimator 750 is coupled to the signal evaluator and comprises an etch stage data extractor 754, a regression module 758, a library matching module 762, and a machine learning system module 766. The etch stage data extractor 754 uses the enhanced measured signal from the signal evaluator 720 and extracts an etch stage value by using one or more of the regression module 758, library matching module 762, and/or the machine learning system module 766. For a detailed description on the use of regression algorithms for determining profile data of structures on a workpiece, refer to U.S. Pat. No. 6,785,638 entitled "METHOD AND SYSTEM OF DYNAMIC LEARNING THROUGH A REGRESSION-BASED LIBRARY GENERATION PROCESS", issued on Aug. 31, 2004, included herein in its entirety by reference. For a detailed description on the use of library algorithms for determining profile data of structures on a workpiece, refer to U.S. Pat. No. 6,943,900 entitled "GENERATION OF A LIBRARY OF PERIODIC GRATING DIFFRACTION SIGNALS", issued on Sep. 13, 2005, included herein in its entirety by reference. For a detailed description on the use of machine learning system algorithms for determining profile data of structures on a workpiece, refer to U.S. Pat. No. 7,831,528 entitled "OPTICAL METROLOGY OF STRUCTURES FORMED ON SEMICONDUCTOR WAFERS USING MACHINE LEARNING SYSTEMS", issued on Nov. 9, 2010, included herein in its entirety by reference.

FIG. 8 is an exemplary architectural diagram illustrating an etch stage measurement system 800 comprising an optical metrology device 804, an etch sensor device 810, and a metrology processor 840. The metrology processor 840 can include a signal evaluator 820 and a metrology data estimator 850. The optical metrology device 804 can be two or more optical metrology devices such as a combination of one or more of an optical emission spectroscope, interferometer or reflectometer, measures a substrate (not shown) and transmits the etch stage measurement 806 to the metrology processor 840. After processing the measurements with the metrology processor 840, an adjustment signal 808 can be sent from the metrology processor 840, for example an angle of incidence or azimuth angle adjustment, to the optical metrology device 804, or an adjustment signal 814, for example a temperature or pressure adjustment, can be sent to the etch sensor device 810. The metrology processor 840 can be a local processor, a remote processor, or a processor accessible via a network such as the Internet. The signal evaluator 820 and the etch stage data extractor 854 can be in the form of executable instructions or computer code resident in the processor 840 or available for execution by the processor 840. The signal evaluator 820 comprises an optical metrology device model 824 which can model two or more optical metrology devices and an etch sensor device model 836 which can model two or more etch sensor devices such as temperature, pressure, or specie composition sensor devices. Other components of the signal evaluator 820 include a calibrator 828 and a signal adjuster 832. The calibrator 828 is configured to determine adjustments to metrology measurements due to differences of components used in a metrology device compared to a standard device in the same category or technology. The signal adjuster 832 enhances the signal by adjusting for the noise in the measured electromagnetic signal for optical metrology device 804, and/or the measured sensor signal 812 from the etch sensor device 810.

Still referring to FIG. 8, the metrology data estimator 850 is coupled to the signal evaluator and comprises an etch stage data extractor 854, a regression module 858, a library matching module 862, and a machine learning system module 866. The etch stage data extractor 854 uses the enhanced measured signal from the signal evaluator 820 and determines an etch stage value by using one or more of the regression module 858, library matching module 862, and/or the machine learning system module 866. For a detailed description on the use of regression algorithms for determining profile data of structures on a workpiece, refer to U.S. Pat. No. 6,785,638 entitled "METHOD AND SYSTEM OF DYNAMIC LEARNING THROUGH A REGRESSION-BASED LIBRARY GENERATION PROCESS", issued on Aug. 31, 2004, included herein in its entirety by reference. For a detailed description on the use of library algorithms for determining profile data of structures on a workpiece, refer to U.S. Pat. No. 6,943,900 entitled "GENERATION OF A LIBRARY OF PERIODIC GRATING DIFFRACTION SIGNALS", issued on Sep. 13, 2005, included herein in its entirety by reference. For a detailed description on the use of machine learning system algorithms for determining profile data of structures on a workpiece, refer to U.S. Pat. No. 7,831,528 entitled "OPTICAL METROLOGY OF STRUCTURES FORMED ON SEMICONDUCTOR WAFERS USING MACHINE LEARNING SYSTEMS", issued on Nov. 9, 2010, included herein in its entirety by reference.

Figure 9:
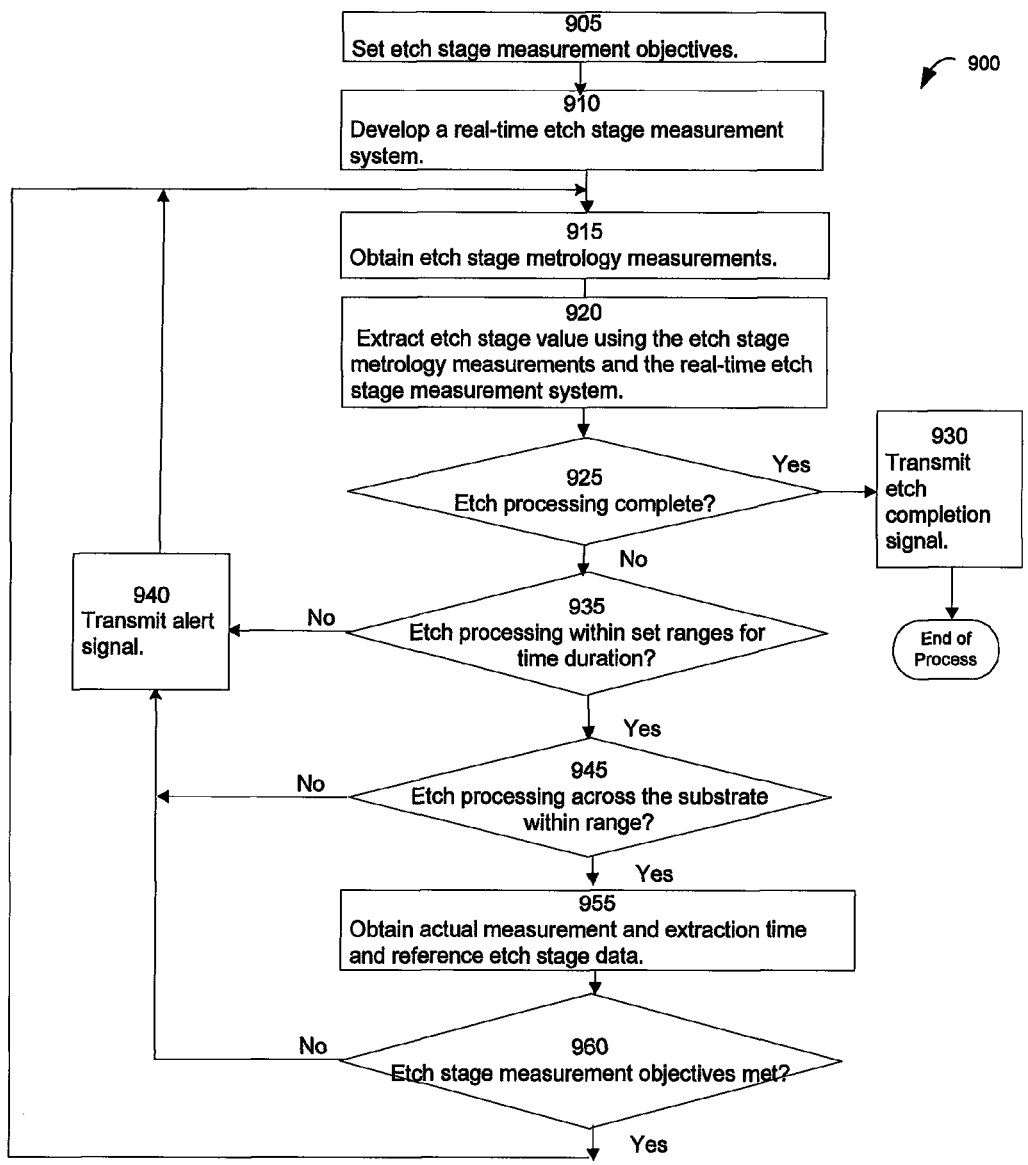
FIG. 9 depicts an exemplary flowchart for a real-time etch stage measurement system.

FIG. 9 depicts an exemplary flowchart for a real-time etch stage measurement system 900 in one embodiment of the present invention. In step 905, the etch stage measurement objectives are set. As mentioned above, etch stage measurement objectives can include accuracy, confidence interval, measurement and extraction time (MAET) objective, repeatability, precision, reproducibility, total measurement uncertainty (TMU), total cost of ownership, and the like. In one embodiment, for example, accuracy, measurement and extraction time, and repeatability are used as the etch stage measurement objectives. In addition, the etch stage measurement objectives can be specified with accuracy set at 0.97 or better, measurement and extraction time at 3 milliseconds or less, and a repeatability coefficient at 0.95 or better. In another embodiment, accuracy, measurement and extraction time, repeatability, and, for example, temperature of the etch chamber or quantity of an etchant specie in the etch chamber are used as etch stage measurement objectives. In step 910, a real-time etch stage measurement system is developed using the methods described in relation to FIGS. 4-6 and using the systems diagrammed and described in relation to FIGS. 7-8. For example, the etch stage measurement system can be developed using two or more optical metrology devices and two or more etch sensor devices.

In step 915, etch stage measurements are obtained using the optical metrology devices and/or etch sensor devices for the selected method and system in step 910. In step 920, the etch stage value is extracted using the etch stage measurements as input and the real-time etch stage measurement system. For example, the etch stage metrology measurement can include two or more optical metrology measurements such as OES spectra and reflectometric and interferometric measurements. In another embodiment, the etch stage measurements can include two or more optical metrology data and sensor data such as temperature, pressure, or etchant specie concentration in the etch chamber.

Still referring to FIG. 9, the etch stage value is extracted using the etch stage measurements and the real-time etch stage measurement system. As mentioned above, etch stage value can be the thickness of the layer or layers that were etched or a percent of the etch target in the one or more layers of the substrate being etched, the target based on a recipe of the application. Extraction of etch stage value is performed using the etch stage measurements and the methods described in relation to FIGS. 4-6 and using the system diagrammed and described in relation to FIG. 7 or 8. In step 925, the extracted stage value is compared to the etch target to determine if the etch processing is complete. If the etch processing is complete, in step 930, the etch completion signal is transmitted to metrology processor (FIG. 2, 216).

If the etch processing is not complete, in step 935, the etch stage value is compared to the set ranges for the elapsed time duration of the etch process. If the etch stage value is not within the set ranges, an alert signal is transmitted to the metrology processor (FIG. 2, 216) in step 940. The etch stage value across the substrate is compared to a set range to ensure the entire substrate is being etched as per the recipe or other set criteria. If the etch processing across the substrate is not within the set range, an alert signal is transmitted in step 940. In step 945, if the etch across the substrate is not within the set range, an alert signal is transmitted in step 940. The actual extraction time and reference etch stage data are obtained in step 955. The actual measurement and extraction time can be recorded by a timer maintained in the metrology processor (FIG. 2, 216). The etch stage measurement objectives are calculated using the extracted etch stage value, the actual measurement and extraction time, and reference etch stage data and compared against the corresponding etch stage measurement objective set in step 905. As mentioned above, the reference etch stage data can be obtained by using reference measurement systems such as those using SEM, AFM, or optical digital profilometry, such AcuShape™ owned by Tokyo Electron Limited and KLA-Tencor Corporation. If the etch stage measurement objectives are not met, an alert signal is transmitted to the metrology processor (FIG. 2, 216) in step 960. Otherwise, the process steps 915 through 960 are iterated until the etch processing is completed as determined in step 925.

Figure 10:
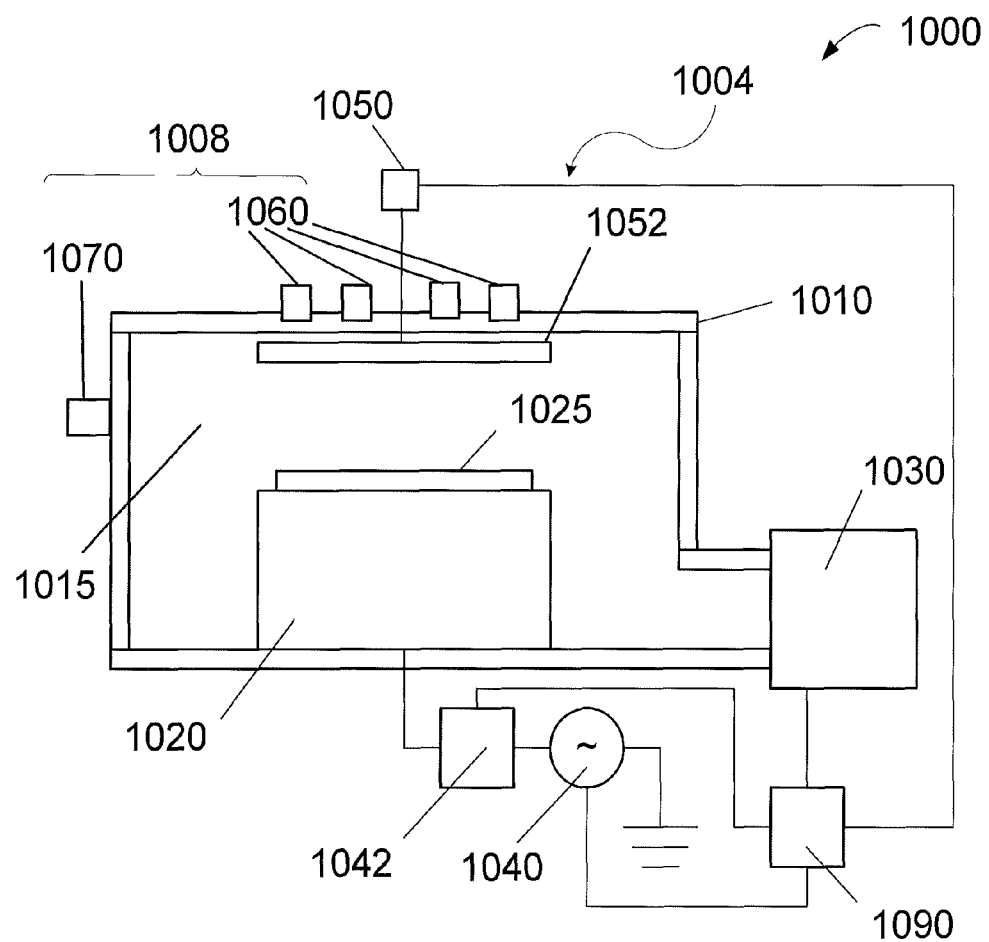
FIG. 10 is an exemplary architectural diagram illustrating an etch system with an etch stage measurement system using two or more optical metrology devices.
Figure 11:
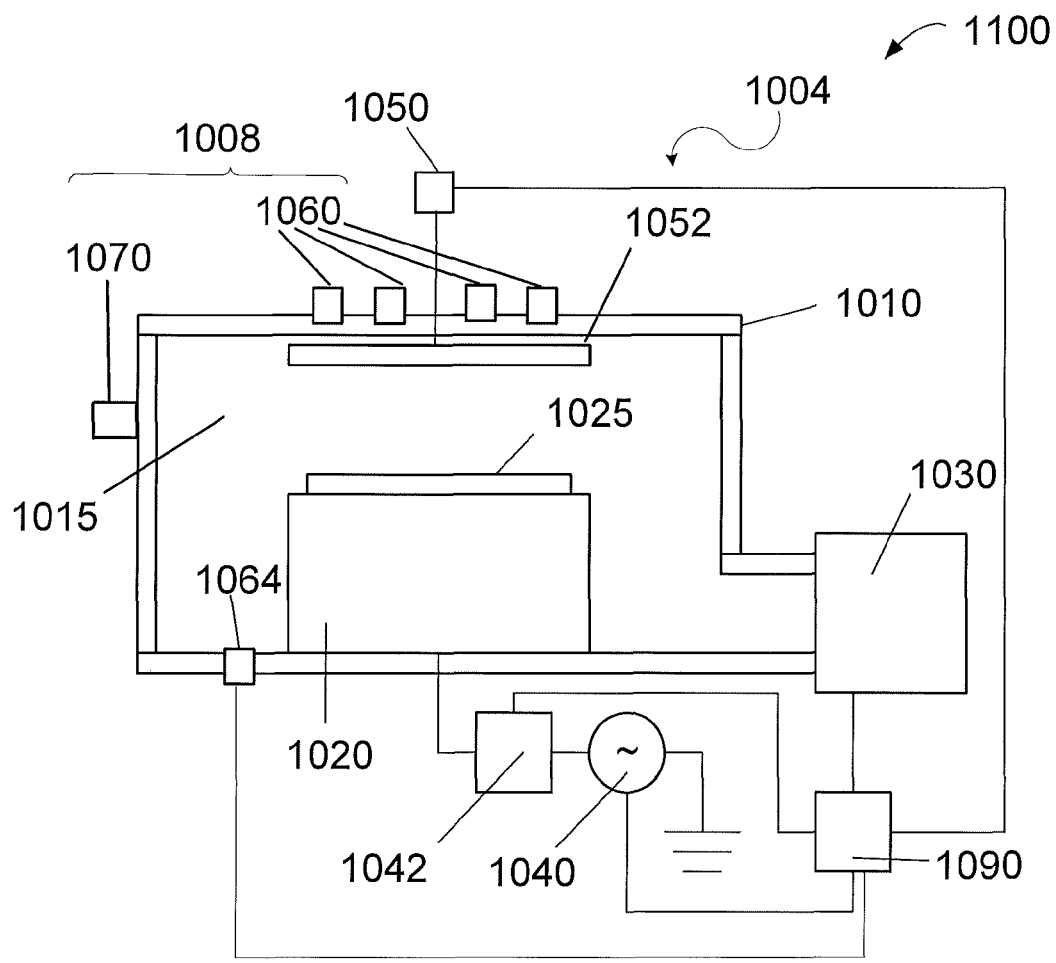
FIG. 11 is an exemplary architectural diagram illustrating an etch system with an etch stage measurement system using two or more optical metrology devices and at least one etch sensor device.
Figure 12:
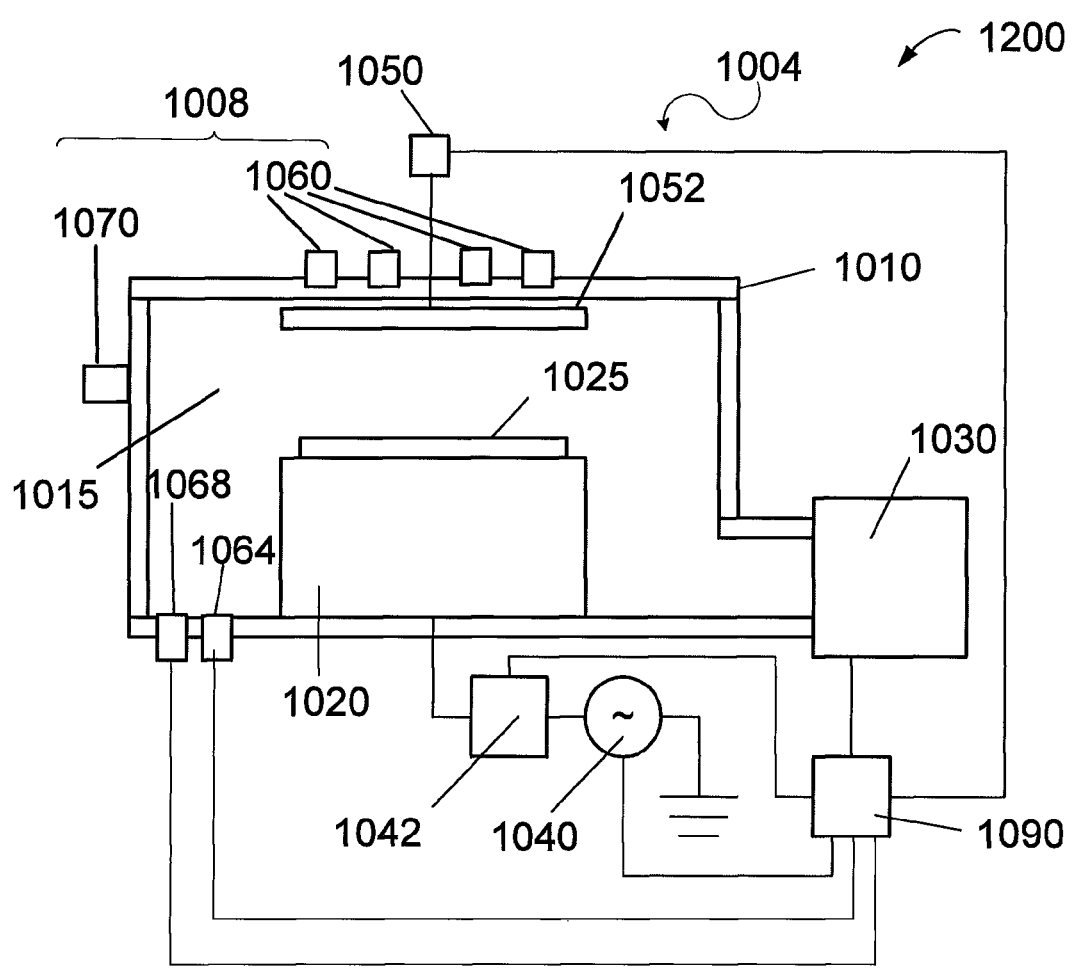
FIG. 12 is an exemplary architectural diagram illustrating an etch system with an etch stage measurement system using two or more optical metrology devices and a plurality of etch sensor devices.

FIGS. 10, 11, and 12 are architectural diagrams illustrating an exemplary etch system comprising a plasma processing system coupled to an etch stage measurement system using various combinations of one or more optical metrology devices and etch sensor devices. Referring to FIG. 10, it is an architectural diagram illustrating an exemplary etch system 1000 comprising a plasma processing system 1004 coupled to an etch stage measurement system 1008 using one or more optical metrology devices. The plasma processing system 1004 optionally comprises a direct current (DC) power supply 1050 coupled to an upper electrode 1052 opposing substrate 1025. The upper electrode 1052 can comprise an electrode plate. The electrode plate can comprise a silicon-containing electrode plate. Moreover, the electrode plate can comprise a doped silicon electrode plate. The DC power supply can include a variable DC power supply. Additionally, the DC power supply can include a bipolar DC power supply. The DC power supply 1050 can further include a system configured to perform monitoring, adjusting, or controlling the polarity, current, voltage, or on/off state of the DC power supply 1050 or any combination thereof. Once plasma is formed, the DC power supply 1050 facilitates the formation of a ballistic electron beam. An electrical filter can be utilized to de-couple radio frequency (RF) power from the DC power supply 1050.

For example, the DC voltage applied to upper electrode 1052 by DC power supply 1050 can range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 1052. The surface of the upper electrode 1052 facing the substrate holder 1020 can be comprised of a silicon-containing material.

Vacuum pump system 1030 can include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP can be employed. TMPs can be used for low pressure processing, typically less than approximately 50 mTorr. For high pressure processing (i.e., greater than approximately 100 mTorr), a mechanical booster pump and dry roughing pump can be used. Furthermore, a device for monitoring chamber pressure (not shown) can be coupled to the plasma processing chamber 1010. The pressure measuring device can be, for example, a Type 628B Baratron absolute capacitance manometer commercially available from MKS Instruments, Inc. (Andover, Mass.).

Referring still to FIG. 10, plasma processing system 1004 further comprises a controller 1090 that comprises a microprocessor, memory, and a digital I/O port capable of generating control voltages sufficient to communicate and activate inputs to plasma processing system 1004 as well as monitor outputs from plasma processing system 1004. Moreover, controller 1090 can be coupled to and can exchange information with RF generator 1040, impedance match network 1042, optional DC power supply 1050, the gas injection system (not shown), vacuum pumping system 1030, as well as the backside gas delivery system (not shown), the substrate/substrate holder temperature control system (not shown), and/or the electrostatic clamping system (not shown). A program stored in the memory can be utilized to activate the inputs to the aforementioned components of plasma processing system 1004 according to a process recipe in order to perform the method of etching a thin film. One example of controller 1090 is a DELL PRECISION WORKSTATION 610™, available from Dell Corporation, Austin, Tex. Controller 1090 can be locally located relative to the plasma processing system 1004, or it can be remotely located relative to the plasma processing system 1004 via an internet or intranet. Thus, controller 1090 can exchange data with the plasma processing system 1004 using at least one of a direct connection, an intranet, or the internet. Controller 1090 can be coupled to an intranet at a customer site (i.e., a device maker, etc.), or coupled to an intranet at a vendor site (i.e., an equipment manufacturer). Furthermore, another computer (i.e., controller, server, etc.) can access controller 1090 to exchange data via at least one of a direct connection, an intranet, or the internet.

The etch stage measurement system 1008 uses two or more optical metrology devices. In particular with FIG. 10, an OES device 1070 is coupled to the plasma processing chamber 1010 at a position to measure the optical emission from the processing region 1015 between the substrate 1025 and the upper electrode 1052. In addition, another set of optical metrology devices 1060 are disposed atop the plasma processing chamber 1010. Although four optical metrology devices are shown, many other alternative and different configurations of the optical metrology devices can positioned to implement design objectives using a plurality of optical metrology devices. The four optical metrology devices can be spectroscopic reflectometric devices or interferometric devices. The measurements from the two or more optical metrology devices, for example, the OES device 1070 and the set of optical metrology devices 1060, are transmitted to the metrology processor (not shown) and processed by the signal evaluator (FIG. 7, 720) (not shown) and a metrology data estimator (FIG. 7, 750) (not shown), where the etch stage value is extracted.

FIG. 11 is similar to the exemplary etch system 1000 in FIG. 10, with the exception that the etch stage measurement system 1008 uses one or more optical metrology device and an etch sensor device 1064. As mentioned above, a process sensor device, for example, a etch sensor device 1064 measuring the amount of an etchant, with measurements substantially correlated to etch stage is selected. In one embodiment, the etch process sensor device that has the highest correlation to etch stage is selected. Selection of at least one process sensor device can be done using multivariate analysis using sets of process data, metrology data (diffraction signals) and process performance data to identify these inter-relationships. In particular with FIG. 11, an OES device 1070 is coupled to the plasma processing chamber 1010 at a position to measure the optical emission from the processing region 1015 between the substrate 1025 and the upper electrode 1052. In another embodiment, another set of optical metrology devices 1060 such as the four optical metrology devices shown are disposed atop the plasma processing chamber 1010. The four optical metrology devices can be spectroscopic reflectometric devices or interferometric devices. The measurements from the two or more optical metrology devices, for example, the OES device 1070 and the set of optical metrology devices 1060 and the measurement from the sensor device 1064 are transmitted to the metrology processor (not shown) and processed by the signal evaluator (FIG. 8, 820) (not shown) and a metrology data estimator (FIG. 8, 850) (not shown), where the etch stage value is extracted.

FIG. 12 is similar to the exemplary etch system 1100 in FIG. 11, with the exception that the etch stage measurement system 1008 uses one or more optical metrology device and a plurality of etch sensor devices, 1064 and 1068. As mentioned above, process sensor devices with measurements substantially correlated to etch stage are selected. In one embodiment, the etch process sensor device that has the highest correlation to etch stage is selected. Selection at process sensor devices can be done using multivariate analysis, using sets of process data, metrology data (diffraction signals) and process performance data to identify these inter-relationships. In particular with FIG. 12, an OES device 1070 is coupled to the plasma processing chamber 1010 at a position to measure the optical emission from the processing region 1015 between the substrate 1025 and the upper electrode 1052. In another embodiment, another set of optical metrology devices 1060 such as the four optical metrology devices shown are disposed atop the plasma processing chamber 1010. The four optical metrology devices can be spectroscopic reflectometric devices or interferometric devices. The measurements from the two or more optical metrology devices, for example, the OES device 1070 and the set of optical metrology devices 1060 and the measurements from the plurality of sensor devices are transmitted to the metrology processor (not shown) and processed by the signal evaluator (FIG. 8, 820) (not shown) and a metrology data estimator (FIG. 8, 850) (not shown), where the etch stage value is extracted.

Figure 13A:
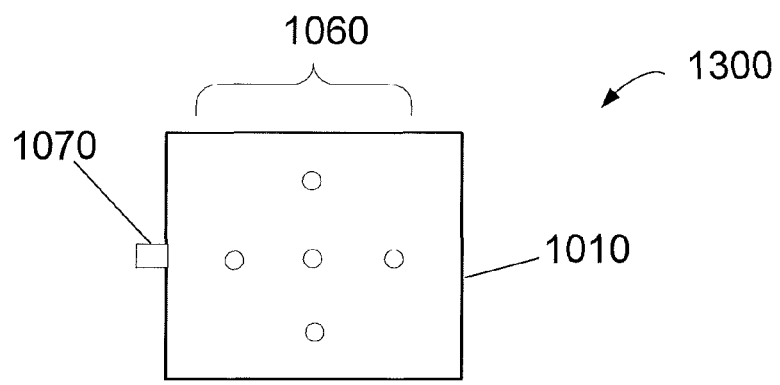
Figure 13B:
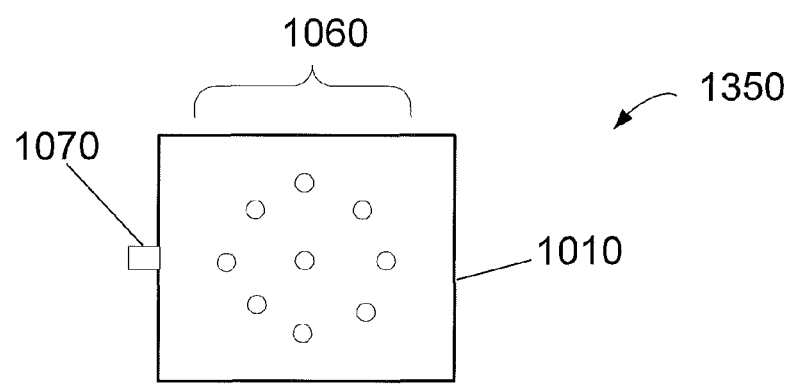
FIG. 13B depicts a top-view of exemplary etch system with a viewports for a plurality of optical metrology devices on the top of the etch system for optical spectroscopic and/or interferometric tools.

FIG. 13A depicts a top-view of an exemplary etch system 1300 with an optical emission spectroscopy (OES) device 1070 and with a plurality of viewports for optical metrology devices 1060 on the top of plasma processing chamber 1010 for optical spectroscopic and/or interferometric tools. The OES device 1070 can be positioned at a location where the other components of the plasma processing chamber allows an unobstructed measurement of optical emission signals, arrangement of the other optical metrology devices 1060 can be positioned as shown. Measurements of diffracted electromagnetic energy from these optical metrology devices are used to determine if the etching of the various sites of the wafer are progressing according to the application recipe. Alternatively, the number of optical metrology devices can be increased, for example, using 5, 7, 9, or 11 optical metrology devices and arranged in other configurations. For example, in FIG. 13B, an exemplary etch system 1350 with nine optical metrology devices can be arranged in a configuration as shown. The specific number of optical metrology devices and configurations are determined based on knowledge and experience with the ranges of semiconductor applications planned to be measured by the etch stage measurement system.

Although exemplary embodiments have been described, various modifications can be made without departing from the spirit and/or scope of the present invention. Therefore, the present invention should not be construed as being limited to the specific forms shown in the drawings and described above. Accordingly, all such modifications are intended to be included within the scope of this invention.

What is claimed:

1. A method for designing an etch stage measurement system involving an etch process for one or more layers on a substrate, the etch stage measurement system comprising metrology devices and a metrology processor, the etch stage measurement system configured to meet two or more etch stage measurement objectives, the etch process performed in an etch process tool, the etch process tool having an etch chamber, a controller, and one or more etch process parameters, the method comprising:
   (a) setting the two or more etch stage measurement objectives;
   (b) selecting two or more optical metrology devices for measuring electromagnetic energy off the chamber or off the substrate during the etch process;
   (c) obtaining etch stage measurements using the selected two or more optical metrology devices;
   (d) obtaining an actual etch stage data for each of the etch stage measurements using one or more reference measurement technologies;
   (e) developing a correlation algorithm of the etch stage measurements to the actual etch stage data;
   (f) extracting an etch measurement value using the developed correlation algorithm and an etch stage measurement using the selected two or more optical metrology devices;
   (g) comparing calculated etch stage measurement objectives using the extracted etch measurement value to the set two or more etch stage measurement objectives; and
   (h) if the set two or more etch stage measurement objectives are not met, modifying the selected two or more optical metrology devices, refining the correlation algorithm, and/or enhancing the etch stage measurement by adjusting for noise in the measured electromagnetic energy and iterating steps (c) to (h) until the two or more etch stage measurement objectives are met,
   wherein refining the correlation algorithm comprises using non-linear functional relationships between the electromagnetic energy measurements and the actual etch stage measurement data,
   wherein the non-linear functional relationships include arbitrary functions, composite functions, and least squares fit solutions wherein least squares fit can include nonlinear fitting methods, searching parameter space methods, grid search methods, gradient search methods, expansion methods, and Marquardt methods.

2. The method of claim 1 wherein the two or more etch stage measurement objectives comprise an accuracy objective and a measurement and extraction time (MAET) objective.

3. The method of claim 2 wherein the two or more etch stage measurement objectives include an accuracy objective of 0.95 and a MAET objective of 6 milliseconds or less.

4. The method of claim 1 wherein a first optical metrology device of the selected two or more optical metrology devices includes a spectrometer disposed to measure the intensity of electromagnetic energy emitted from the etch chamber.

5. The method of claim 1 wherein a second optical metrology device of the two or more selected optical metrology devices includes at least one interferometer or reflectometer disposed above the etch chamber so as to allow transmission of an illumination beam and detection of a diffraction beam using a viewport.

6. The method of claim 1 wherein a second optical metrology device of the two or more selected optical metrology devices includes a plurality of interferometers or reflectometers disposed above the etch chamber using viewports so as to allow transmission of a plurality of illumination beams and detection of a plurality of diffraction beams.

7. The method of claim 6 wherein the second optical metrology device includes 5 to 9 interferometers or reflectometers.

8. The method of claim 6 wherein the plurality of illumination beams include a spectroscopic beam with wavelengths in the range of 120 to 190 nanometers.

9. The method of claim 6 wherein the plurality of illumination beams include a spectroscopic beam with wavelengths in the range of 170 to 190 nanometers or 120-1000 nanometers.

10. The method of claim 6 wherein the plurality of illumination beams include a monochromatic beam in the range of 120 to 190 nanometers or 120-1000 nanometers.

11. The method of claim 6 wherein angle of incidence of the plurality of illumination beams to the substrate is from 1 to 10 degrees or substantially 0 degrees.

12. The method of claim 1 wherein the two or more etch stage measurement objectives comprise accuracy, measurement and extraction time (MAET), and repeatability coefficients of two or more etch stage measurements.

13. The method of claim 12 wherein the etch stage measurement objectives include accuracy of 0.95 or better, a MAET objective of 6 milliseconds or less, and repeatability coefficients of two or more etch stage measurements of 0.95 or better.

14. The method of claim 1 wherein the extracted etch measurement data is the depth of the etched layer or the percent completion of the etch process according to a recipe of the etch process.

15. The method of claim 1 wherein modifying the selected two or more optical metrology devices comprises adjusting optical components of the selected two or more optical metrology devices.

16. The method of claim 1 wherein modifying the selected two or more optical metrology devices comprises replacing optical components of the selected two or more optical metrology devices or installing a new optical metrology device.

17. The method of claim 1 wherein enhancing the etch measurement data is performed by adjusting for noise in the electromagnetic energy measurements using a calibration process with known substrate samples for types of substrates to be measured with the etch stage measurement system.

18. A method for designing an etch stage measurement system involving an etch process for one or more layers on a substrate, the etch stage measurement system comprising metrology devices and a metrology processor, the etch stage measurement system configured to meet two or more etch stage measurement objectives, the etch process performed in an etch process tool, the etch process tool having an etch chamber, a controller, and one or more etch process parameters, the method comprising:

(a) setting the two or more etch stage measurement objectives;
(b) selecting two or more optical metrology devices for measuring electromagnetic energy off the chamber or off the substrate during the etch process and selecting at least one etch process sensor device that measures an etch process parameter and wherein the etch process parameter has a high correlation to the etch stage;
(c) obtaining etch stage measurements using the selected two or more optical metrology devices;
(d) obtaining etch stage measurements using the selected at least one etch process sensor device;
(e) obtaining actual etch stage data for each of the etch stage measurements using one or more reference measurement technologies;
(f) developing a correlation algorithm of the etch stage measurements to the actual etch stage data;
(g) extracting an etch measurement value using the developed correlation algorithm and etch stage measurements obtained using the selected two or more optical metrology devices and the selected at least one etch process sensor device;
(h) comparing calculated etch stage measurement objectives using the extracted etch measurement value to the set two or more etch stage measurement objectives;
(i) if the set two or more etch stage measurement objectives are not met, modifying the selected two or more optical metrology devices, selecting a different etch process sensor device, refining the correlation algorithm, and/or enhancing the etch stage measurements obtained using the selected two or more optical metrology devices and the selected at least one etch process sensor devices by adjusting for the noise, and iterating steps (c) to (i) until the two or more etch stage measurement objectives are met, wherein refining the correlation algorithm comprises using non-linear functional relationships between the electromagnetic energy measurements and the actual etch stage measurement data, wherein the non-linear functional relationships include arbitrary functions, composite functions, and least squares fit solutions wherein least squares fit can include nonlinear fitting methods, searching parameter space methods, grid search methods, gradient search methods, expansion methods, and Marquardt methods.

\* \* \* \* \*